United States Patent
Dumoulin et al.

(10) Patent No.: US 9,396,561 B2
(45) Date of Patent: Jul. 19, 2016

(54) CORRELATION IMAGING FOR MULTI-SCAN MRI WITH MULTI-CHANNEL DATA ACQUISITION

(71) Applicant: Children's Hospital Medical Center, Cincinnati, OH (US)

(72) Inventors: Charles L. Dumoulin, Cincinnati, OH (US); Yu Li, Blue Ash, OH (US)

(73) Assignee: Children's Hospital Medical Center, Cincinnati, OH (US)

( * ) Notice: Subject to any disclaimer, the term of this patent is extended or adjusted under 35 U.S.C. 154(b) by 39 days.

(21) Appl. No.: 14/370,880

(22) PCT Filed: Jan. 4, 2013

(86) PCT No.: PCT/US2013/020251
§ 371 (c)(1),
(2) Date: Jul. 7, 2014

(87) PCT Pub. No.: WO2013/103791
PCT Pub. Date: Jul. 11, 2013

(65) Prior Publication Data
US 2014/0376794 A1    Dec. 25, 2014

Related U.S. Application Data

(60) Provisional application No. 61/583,769, filed on Jan. 6, 2012.

(51) Int. Cl.
*G06T 11/00* (2006.01)
*G01R 33/561* (2006.01)

(52) U.S. Cl.
CPC .......... *G06T 11/003* (2013.01); *G01R 33/5611* (2013.01); *G01R 33/5619* (2013.01)

(58) Field of Classification Search
None
See application file for complete search history.

(56) References Cited

U.S. PATENT DOCUMENTS

| | | | |
|---|---|---|---|
| 5,036,280 A | 7/1991 | Chesavage | |
| 2005/0197587 A1 | 9/2005 | Rudy et al. | |
| 2008/0279433 A1* | 11/2008 | Brau | G01R 33/3415 382/131 |
| 2009/0262996 A1* | 10/2009 | Samsonov | G01R 33/4818 382/130 |
| 2011/0286646 A1 | 11/2011 | Chen et al. | |
| 2014/0126796 A1* | 5/2014 | Chesneau | G01R 33/4842 382/131 |
| 2015/0127291 A1* | 5/2015 | Ying | G01R 33/5611 702/104 |

OTHER PUBLICATIONS

Extended European Search Report, from Application No. 13733616.0 from PCT/US2013/020251 with an international filing date of Jan. 4, 2013, mailed from the European Patent Office on May 21, 2015, 12 pages.

(Continued)

*Primary Examiner* — Siamak Harandi
*Assistant Examiner* — Narek Zohrabyan
(74) *Attorney, Agent, or Firm* — Baker & Hostetler LLP

(57) ABSTRACT

A framework is provided for accelerating multi-scan and multi-channel data acquisition in a clinical MRI protocol by estimating correlation functions from images previously acquired or reconstructed, with the same or with different contrast and resolution. Using an MRI apparatus, the method collects a plurality of prior MRI image scan data sets, obtains a current MRI scan data, and reconstructs the current MRI scan data set using an aggregate of the plurality of prior MRI image data sets. The method provided may optimize previously acquired MRI image data sets to reconstruct an MRI image scan data set and image.

44 Claims, 23 Drawing Sheets

(56) References Cited

OTHER PUBLICATIONS

Li, Yu et al., "Correlation imaging for multiscan MRI with parallel data acquisition", Magnetic Resonance in Medicine, Feb. 28, 2012, pp. 2005-2017, vol. 68 No. 6, Wiley Periodicals.

Li, Yu et al., "Correlation-based reconstruction for parallel imaging", Proc. Intl. Soc. Mag. Reson. Med., May 7, 2011, p. 745, vol. 19.

Cao, Yue et al., "Feature-recognizing MRI", Magnetic Resonance in Medicine, Sep. 1, 1993, pp. 305-317, vol. 30 No. 3, Williams & Wilkins.

Samsonov, A A et al., "Accelerated Serial MR Imaging in Multiple Sclerosis Using Baseline Scan Information", Proc. Intl. Soc. Mag. Reson. Med., May 1, 2010, p. 4876.

Tsao, Jeffrey et al., "k-t Blast and k-t Sense: dynamic MRI with high frame rate exploiting spatiotemporal correlations", Magnetic Resonance in Medicine, Nov. 1, 2003, pp. 1031-1042, vol. 50 No. 5, Wiley-Liss, Inc.

Uecker, Martin et al., "Real-time MRI at a resolution of 20 ms", NMR in Biomedicine, Aug. 27, 2010, pp. 986-994, vol. 23 No. 8, John Wiley & Sons, Ltd.

Griswold, M A et al., "Rapid evaluation of cardiac function using undersampled radial trueFISP with GRAPPA", Proc. Intl. Soc. Mag. Reson. Med., May 15, 2004, p. 637, vol. 19.

Bauer, S et al., "Improved parallel imaging with GRAPPA with large virtual coils arrays for time-resolved applications", Proc. Intl. Soc. Mag. Reson. Med., May 7, 2011, p. 2882, vol. 19.

Liang, Z-P et al., "Constrained reconstruction methods in MR imaging", Reviews of Magnetic Resonance in Medicine, Jan. 1, 1992, pp. 67-185, vol. 4, Pergamon Press, New York, NY, US.

International Search Report and Written Opinion, from PCT/US2013/020251 with an international filing date of Jan. 4, 2013, mailed from the United States Receiving Office of the PCT on Mar. 23, 2013, 14 pages.

Li, Yu, "Correlation Imaging with Arbitrary Sampling Trajectories", Magnetic Resonance, Imaging, Jun. 2014, 32(5), 551-562.

Li et al, "K-t Reconstruction of Undersampled Wavelet-Space for Real-Time Free-Breathing Cardiac Imaging", Joint Annual Meeting ISMRM-ESMRMB 2014, May 10-16, 2014, Milan, Italy,1 page abstract No. 0432.

Li et al, "Wavelet-Space Correlation Imaging for High-Speed MRI without Motion Monitoring or Data Segmentation", Magnetic Resonance in Medicine, Dec. 2015, 74(6), 1574-1586.

Li, Yu, "Non-Segmented Free-Breathing Cardiac Imaging Using Low-Rank Matrix Completion with a k-space Variant Constraint", ISMRM 23rd Annual Meeting & Exhibition, May 30-Jun. 5, 2015 • Toronto, Ontario, Canada, 1 page, Abstract No. 3800.

Li, Yu, "Parallel Imaging Acceleration Beyond Coil Limitation Using a k-space Variant Low-rank Constraint on Correlation Matrix", ISMRM 23rd Annual Meeting & Exhibition, May 30-Jun. 5, 2015 • Toronto, Ontario, Canada, 1 page, Abstract No. 3625.

\* cited by examiner

EXAMPLES OF CORRELATION FUNCTIONS CALCULATED USING EQ. 1 FROM ANATOMICAL (TOP) AND ANGIOGRAPHIC (BOTTOM) IMAGES.

Projection of Correlation Functions Along the Dotted Lines in 2D Figures on the Left.

CORRELATION IMAGING FOR MULTI-SCAN MRI WITH MULTI-CHANNEL DATA ACQUISITION

CROSS-REFERENCE TO RELATED APPLICATIONS

The present application is a national stage entry of PCT/US2013/020251, filed Jan. 4, 2013, which claims the benefit of U.S. Provisional Application Ser. No. 61/583,769, filed Jan. 6, 2012.

FIELD

The present invention relates to a Magnetic Resonance Imaging (MRI) method for economizing total scan time of a multi-scan MRI session while preserving, or even enhancing, the quality of the scans. Preferably, it relates to an integrated system to overcome speed limits of clinical MRI using correlation imaging. The system works with any MRI scan acquisition technique including those techniques which already incorporate fast data acquisition speed.

BACKGROUND

Magnetic resonance imaging (MRI) is ideal for clinical imaging because it is information-rich and clinically safe. However, many MRI techniques cannot enter the realm of clinical utility because MRI has an intrinsically low data acquisition speed that may limit the spatial or temporal specificity of a clinical examination, introduce motion artifacts, and reduce the patient throughput. Over the years, a number of high-speed data acquisition techniques have been developed to address this fundamental challenge to clinical MRI. These include partial Fourier imaging, parallel imaging and compressed sensing. Among them, parallel imaging is the only technique that has successfully transformed clinical MRI by offering the capability of accelerating a single MRI scan by a factor of >2. Currently, two standard parallel imaging frameworks for clinical applications are SENSE and GRAPPA. Currently, all well-used high-speed imaging techniques implemented on available clinical MRI systems, e.g. GE-ASSET/ARC, SIEMENS-iPAT, and PHILIPS-SENSE/BLAST, are based on one of these two frameworks.

Parallel imaging follows a deterministic path to reconstruct images from undersampled data. This deterministic approach may meet a number of practical problems associated with unpredictable factors in clinical scans. For example, SENSE uses coil sensitivity profiles to calculate a deterministic relationship between reduced field of view (FOV) images and the final image. On a clinical MRI scanner, coil sensitivity calibration relies on a single calibration scan at the beginning of a clinical protocol. Unpredictable image information, scan parameters and patient motion in subsequent scans may invalidate the calibration, and produce artifacts in the reconstructed images. For this reason, most clinical MRI protocols with SENSE use a conservative acceleration factor (<3 in 2D imaging). For the same reason, many clinicians prefer GRAPPA with auto-calibration signals (ACS) acquired simultaneously with each clinical scan although this data acquisition scheme considerably slows down the entire clinical protocol. SENSE artifacts on a clinical scanner are introduced by unpredictable image information, acquisition parameters and motion during the clinical scans after calibration.

SENSE and GRAPPA accelerate MRI data acquisition by sampling data below the Nyquist criterion. The reconstruction from the undersampled data to an aliasing-free image relies on the spatial encoding provided by multi-channel coil sensitivity. This reconstruction relationship requires calibration using fully sampled data. In SENSE, a calibration scan is performed before the real scan. In GRAPPA, auto-calibration signals (ACS) are acquired simultaneously with the real scan. In these schemes, the calibration of reconstruction relies on a single set of low-resolution data acquired from the calibration scan or the ACS. The calibration for SENSE is performed at the beginning of the protocol and used for all the following scans. In GRAPPA, ACS data are acquired in every scan and each scan is reconstructed individually. All multi-scan data offer the capability of calibration because they share the same coil sensitivity information. If all of these data are efficiently used for calibration, more information about coil sensitivity can be extracted and the reconstruction may be improved. This also implies the repetitive ACS data acquisition may not be necessary, allowing for higher imaging acceleration. Therefore, SENSE and GRAPPA have not taken the most advantage of data availability in multi-scan imaging. Furthermore, it should be noted that multi-scan imaging data are acquired from the same human subject in a clinical protocol thereby sharing the anatomical structure information that may be used to further improve reconstruction. For example, the magnitude of most images in MRI dominates the phase because anatomical structure has few boundaries that may affect B0 field inhomogeneity. The k-space data, if without coil sensitivity, are thus nearly conjugate symmetric. This correlation between the original and the conjugate symmetric data has been used in partial Fourier imaging and is also shared by multi-scan imaging data. However, standard parallel imaging frameworks for clinical imaging have not benefited from this apparent information sharing. On currently available MRI systems, as SENSE and GRAPPA frameworks rely totally on the spatial encoding capability of coil sensitivity, their acceleration is physically limited by the configuration of a coil array in data acquisition.

In MRI, coil array design poses a physical limit to parallel imaging acceleration because reconstruction from undersampled data relies on the data relationship introduced by multi-channel coil sensitivities.

Information sharing has been frequently used in high-speed MRI. For example, SENSE uses coil sensitivity information shared by a calibration scan and clinical scans. GRAPPA uses the information shared by the ACS and the real scan data. A number of dynamic imaging techniques, such as keyhole, constrained reconstruction, dynamic imaging by modeling, UNFOLD, reduced FOV imaging, k-t SENSE/BLAST and k-t GRAPPA, . . . , etc., use the static or a priori information shared by all the images acquired from a dynamic scan. If slice gaps are small (close to zero), a multi-slice imaging scan may use image similarity between neighboring slices. Most of these techniques follow deterministic physical mechanisms to calculate or model the shared information across images. Because the unpredictable imaging contrast, resolution or geometry may interfere with the deterministic calculation or modeling, these techniques require either that the image information be removed, e.g. SENSE uses only coil sensitivity profiles without any image contrast information, or that the information is extracted only from those images with minor contrast difference (not as significant as the difference between T1 and T2 contrast), e.g. ACS data from the same scan (8,31), all dynamic images from the same dynamic scan (10,11,26), or neighboring slices with zero gaps (30). These prior strategies have been demonstrated to be effective in high-speed MRI for single-scan (static or dynamic) data acquisition.

In contrast to these frameworks, correlation imaging discussed in the present disclosure follows a statistical route to estimating the shared information from multi-scan imaging data that have dramatically different imaging contrast (e.g. T1 and T2 contrast difference), resolution or geometry. The statistical characterization of the average behavior of a large amount of imaging data reduces the interference from varying information providing a robust approach to utilizing information sharing to speed up multi-scan and multi-channel data acquisition in a clinical MRI protocol. The current disclosure provides the framework of correlation imaging for uniform undersampling, and introduces a practical approach to the statistical characterization of information sharing for image reconstruction. The presented experimental results demonstrate that correlation imaging offers the capability of using shared information across images with different contrast and resolution. Also demonstrated is the ability of correlation imaging to overcome the speed limit posed by a radiofrequency (RF) coil array because of the use of information beyond coil sensitivity in reconstruction.

In the framework of correlation imaging, correlation functions are used to mathematically describe a generic data relationship, and the reconstruction relies on the estimation of correlation functions from prior knowledge about imaging data. In a high-resolution brain imaging experiment using an 8-channel head coil array with at most 4 elements in any physical direction, it is demonstrated that a conventional parallel imaging technique performs well only if an acceleration factor≤4 is used, while the correlation-based reconstruction provides excellent image quality even with an acceleration factor far beyond that limit.

SUMMARY

In high-speed MRI, data acquisition is accelerated by undersampling. The present disclosure pertains to systems and method for reconstructing an MRI image from undersampled MRI data acquisitions.

An embodiment of the present invention provides a method of economizing total scan time of a clinical magnetic resonance imaging (MRI) protocol using an MRI apparatus, where the method includes the steps of: collecting a plurality of prior MRI image scan data sets for a subject; obtaining a current MRI scan data set for the subject; and reconstructing the current MRI scan data set using an aggregate of the plurality of prior MRI image data sets as a reference. In a more detailed embodiment, the method further includes the step of aggregating the plurality of prior MRI image data sets. In an even more detailed embodiment the aggregating step includes a step of estimating correlation functions of the plurality of prior MRI image data sets; and such prior MRI image data sets may include multi-scan and multi-channel information. In an alternate detailed embodiment, the aggregating step may include a step of dynamic scan imaging.

The prior MRI image data sets may include under-sampled MRI image data. The prior MRI image data sets may include calibration MRI image data. The current MRI scan data set may be an under-sampled MRI image data set. Reconstructing the current image may include solving for a linear predictor for reconstruction from undersampled data to the fully-sampled data.

In some embodiments, reconstructing the current MRI data set may include solving a set of linear equations with the shared unfolding matrix as unknowns, and the multi-scan images as the coefficients. Reconstructing an MRI scan may be modeled as a linear predictor from the prior MRI data and current MRI data. The linear predictor coefficients are correlation functions estimated from a plurality of prior MRI image data sets. The correlation functions may be updated upon the completion of each scan.

The method may further include the step of aggregating the current MRI scan data set with the plurality of prior MRI image data sets for use in reconstructing a subsequent MRI scan image.

Current and prior MRI data set information may include two-dimensional, three-dimensional or four-dimensional information. In certain embodiments, the current and prior MRI data set information includes spatial information and temporal information.

In certain embodiments, the current and prior MRI data set scans are of the same subject. The current and prior MRI data set scans may be a same location with the same subject. In certain embodiments, the current and prior MRI data set scans are not all of the same location with the same subject. In certain embodiments, the current and prior MRI data set scans are all near the same location with the same subject, where slice scans are thicker than the slice gap separating each scan.

The method may further include the step of ordering the collection of prior MRI image scan data to increase the value of the aggregate MRI image scan data. A weight may be assigned to each scan based on the impact in time of the scan; and reconstructing the composite image by selecting the scans with the most weight for the aggregate scan data. In certain embodiments, the prior MRI data set scans include at least five prior MRI data set scans.

In certain embodiments, the current and prior MRI data set scans are taken using the same MRI scan protocols. The protocol prior scans or the current scan may be acquired by one of: parallel imaging, SENSE, or GRAPPA.

In certain embodiments, the current scan has an acceleration factor. In a further detailed embodiment, the acceleration factor increases dynamically with each additional cycle of data acquisition. In certain embodiments, the acceleration factor is independent from a number of coil elements in a phase encoding direction of the MRI apparatus.

In certain embodiments, increasing the number of prior scans within a similar location suppresses artifacts of an MRI.

In certain embodiments, the current scan is one of a sagittal, coronal, or axial plane. In certain embodiments, the current scan is a 2-D image, a 3-D image, or a 4-D scan including one of a temporal cycle.

In certain embodiments, the aggregate scan data includes a coil sensitivity information and anatomical information.

In certain embodiments, the method further includes a step of assigning a weight to each scan based on the impact in time of the scan; and reconstructing the composite image by selecting the scans with the most weight for the aggregate scan data.

Another embodiment pertains to an MRI scan system including an image processor component configured to perform the method as set forth above.

Another embodiment pertains to a method of economizing total scan time of a clinical magnetic resonance imaging (MRI) protocol using an MRI apparatus that includes the steps of: (a) performing a plurality of initial scans of a subject using the MRI apparatus to acquire a plurality of initial scan image data; (b) aggregating the plurality of initial scan data to provide an aggregate scan data; (c) performing an under-sampled current scan of the subject using the MRI apparatus to acquire a current scan data; and (d) reconstructing the current scan data using the aggregate scan data. In a more detailed embodiment the aggregating step may include a step of estimating the correlation functions of the plurality of scans.

In a more detailed embodiment, the method may further include: (e) aggregating the current scan data with the plurality of initial scans; and (f) repeating steps (c) through (e) within a single MRI protocol. In certain embodiments, each scan (c) through (e) is performed on approximately a same slice on the subject.

In certain embodiments, each current scan of an iteration of data acquisition is one of a slightly different contrast, resolution, offset, or offset angle from a previous scan.

In certain embodiments, at least one initial scan is a calibration scan.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

In the current disclosure, a detailed embodiment of a framework of correlation imaging is disclosed and a statistical approach to estimating correlation functions from previous images is demonstrated. This framework provides an approach to economize the total data acquisition time of multi-scan and multi-channel imaging for a clinical MRI protocol by utilizing the shared information across images acquired with different contrast and resolution in different scans. Because correlation functions allow using information beyond coil sensitivity, correlation imaging can overcome the speed limit posed by the spatial encoding capability of a receive coil array.

Figure 1:
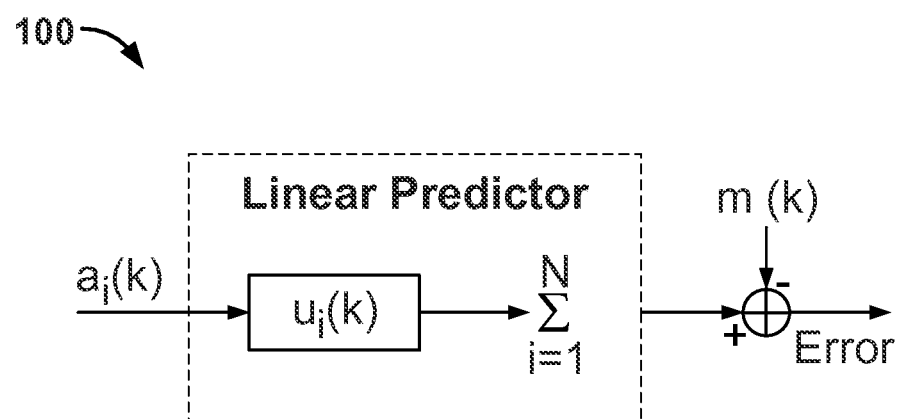
FIG. 1 shows a linear prediction model for parallel imaging reconstruction.

In high-speed MRI, data acquisition is accelerated by undersampling. Reconstruction can be considered as the linear prediction of real data from undersampled data. Linear prediction theory has been well-established in the field of signal processing. FIG. 1 shows a linear prediction model 100 for high-speed MRI.

Parallel imaging provides a solution to accelerating a single MRI scan using multi-channel coil sensitivity information. A clinical MRI protocol for patient screening, however, typically needs a series of MRI scans for acquiring a number of images with different contrast and geometry. Since all of the data in a clinical protocol may be acquired from the same patient with the same coil array, the shared information among all the scans can be used to optimize multi-scan imaging in aggregate. The current disclosure presents an approach to multi-scan acceleration by combining multi-channel acceleration mechanisms underlying parallel imaging and the shared information of a multi-scan acquisition. Since the synergy of these mechanisms relies, in one embodiment, on the estimate of auto- and cross-channel correlation functions from multi-channel and multi-scan imaging data, that approach may be called "correlation imaging". The current disclosure also describes a three-scan anatomical correlation imaging protocol that outperforms conventional parallel imaging techniques optimized for single-scan MRI.

Figure 2:
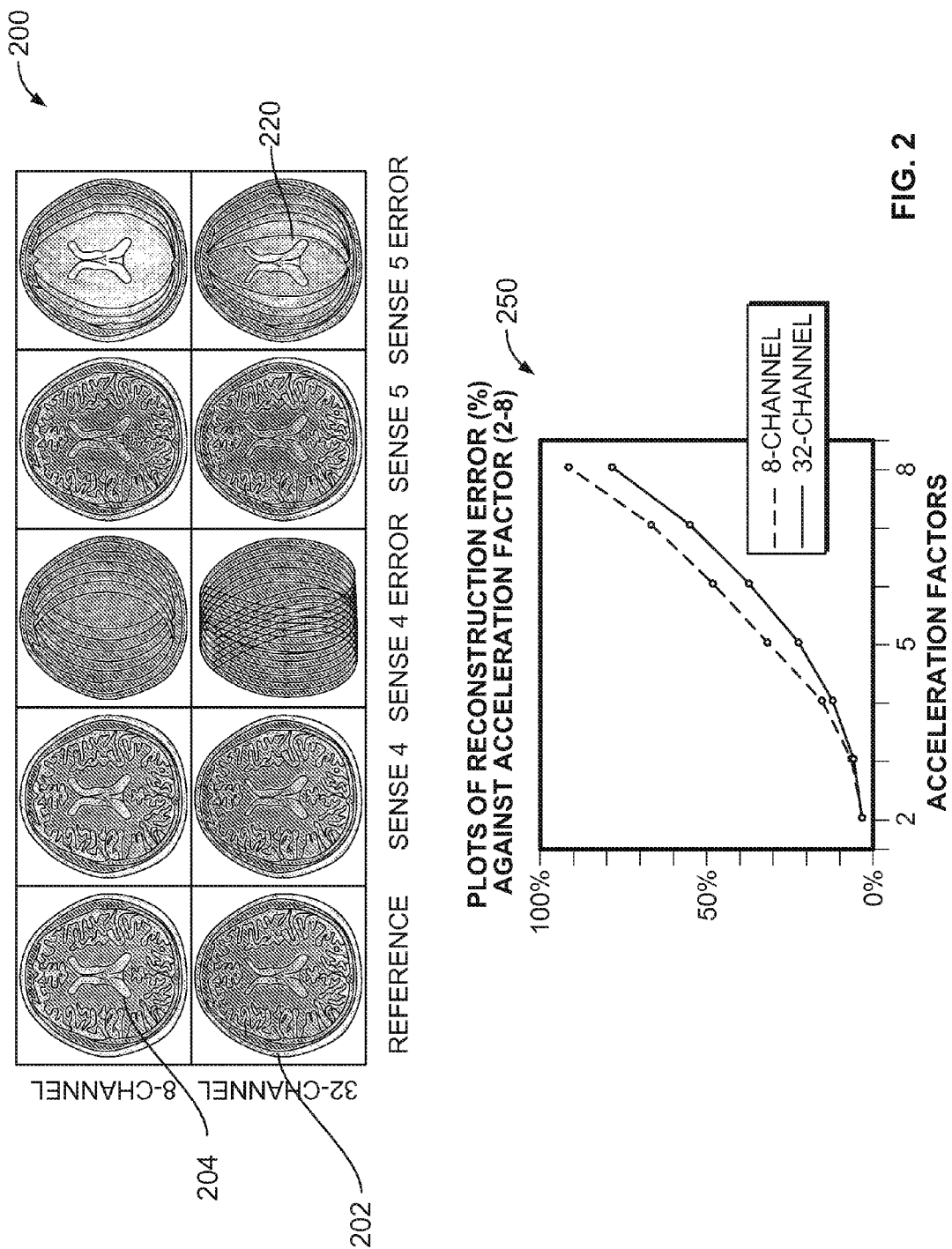
FIG. 2 shows parallel imaging performance of an 8-channel and a 32-channel neuroimaging coil array.

FIG. 2 shows the parallel imaging performance of an 8-channel and a 32-channel neuroimaging coil array constructed on a mechanical former with suitable dimensions for the accommodation of 95% of American adults. Two sets of axial images 200 were acquired on a 3T MRI scanner respectively with the 8-channel and 32-channel coils. A T2-weighted turbo spin echo sequence (FOV 230×230 mm, matrix 256×400, TR/TE 3000/100 ms, flip angle 90 degrees, 24 slices with 4 mm thickness and 1 mm gap) was used. Fully sampled data were undersampled and reconstructed using an acceleration factor of 5, with the coil sensitivity profile calculated from a 3D calibration scan. The conclusion is that SENSE with a 32-channel coil 202 gives lower errors and fewer aliasing artifacts than that with an 8-channel coil 204, as can be seen in the plot 250. However, if using an acceleration factor over the current maximum acceleration factor (=4) allowed on a clinical scanner for 2D imaging (e.g. SENSE 5), SENSE with the 32-channel coil gives unacceptable imaging quality in the center of brain due to the low RF sensitivity demonstrating that parallel imaging cannot offer the capability of translating the potential imaging acceleration gain of 32-channel coil array into neuroimaging applications.

The disclosure pursues the optimum approach to high-speed MRI in clinical MRI and provides the framework of a new high-speed MRI technology, correlation imaging, and translates this framework into clinical MRI protocols for accelerating multi-scan and multi-channel data acquisition. In this framework, the current disclosure provides a statistical path to speeding up MRI beyond the parallel imaging acceleration limit posed by a coil array by utilizing the information sharing of multi-scan and multi-channel imaging data to economize the total scan time of a clinical MRI protocol.

FIG. 3(a) illustrates two frameworks 300 and 350 for single-scan data acquisition. From the perspective of imaging physics, SENSE or GRAPPA gives a generic solution to accelerating the data acquisition for single-scan and multi-channel imaging providing an ideal framework that can be integrated into an arbitrary pulse sequence for clinical translation.

Figure 3:
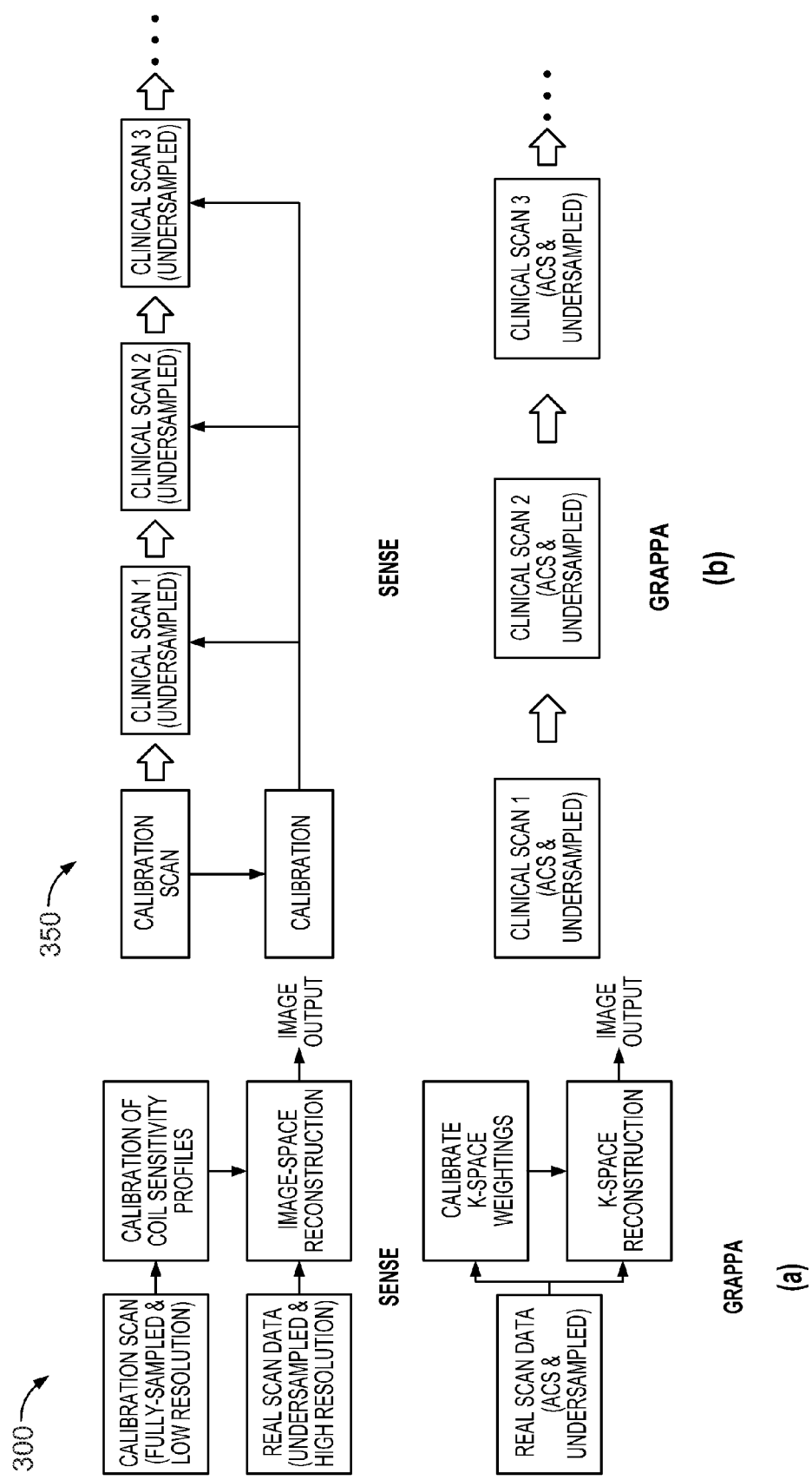
FIG. 3 shows a framework of SENSE and GRAPPA for clinical MRI: (a) Frameworks for single-scan data acquisition; (b) Integration of single-scan acceleration schemes with a clinical MRI protocol that requires multi-scan imaging.

From the perspective of clinical practice, however, the frameworks 300 and 350 illustrated by FIG. 3(a) are not designed to meet the specific needs of clinical MRI. FIG. 3 depicts the framework of SENSE and GRAPPA for clinical MRI: FIG. 3(a) depicts frameworks 300 for single-scan data acquisition. A clinical MRI protocol typically requires multiple-scan imaging. For example, a neuroimaging protocol for brain or tumor screening includes several T1-weighted scans, several T2-weighted scans, a fluid-attenuated inversion-recovery scan, and a diffusion-weighted scan depending on clinical needs. FIG. 3(b) depicts the integration of single-scan acceleration schemes with a clinical MRI protocol that requires multi-scan imaging 350. To integrate SENSE and GRAPPA into a clinical MRI protocol, the schemes 350 shown in FIG. 3(b) are used in clinical practice.

Figure 4:
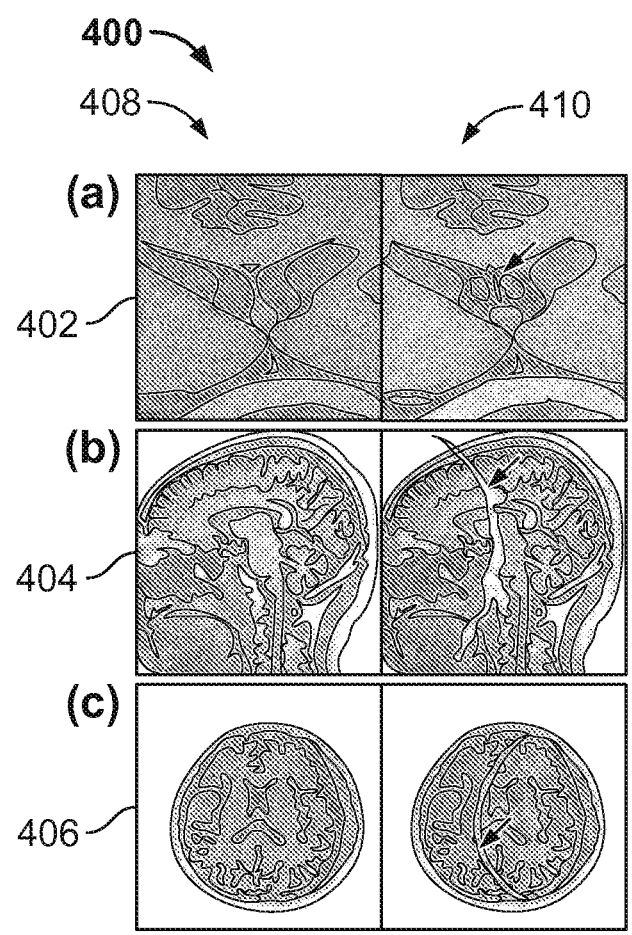
FIG. 4 shows examples of SENSE artifacts on a clinical scanner.

FIG. 4(a) shows the imaging data 402 acquired in a clinical scan contains unexpected high resolution information that cannot be resolved using the low-resolution coil sensitivity profile calibrated from a calibration scan introducing signal voids in the center of brain. FIG. 4(b) shows the integrity of a clinical scan 404 is unexpectedly compromised (with minor image overlap on the posterior skin tissue) introducing aliasing artifacts in the center of brain due to miscalibration of coil sensitivity. FIG. 4(c) shows motion may invalidate the calibration of coil sensitivity profile introducing aliasing artifacts in reconstruction 406. In FIG. 4(a), FIG. 4(b) and FIG. 4(c), the left column 408 gives the reference images reconstructed without SENSE acceleration. The right column 410 shows artifacts in reconstructed images with SENSE acceleration. The arrows indicate the location of artifacts.

Figure 5:
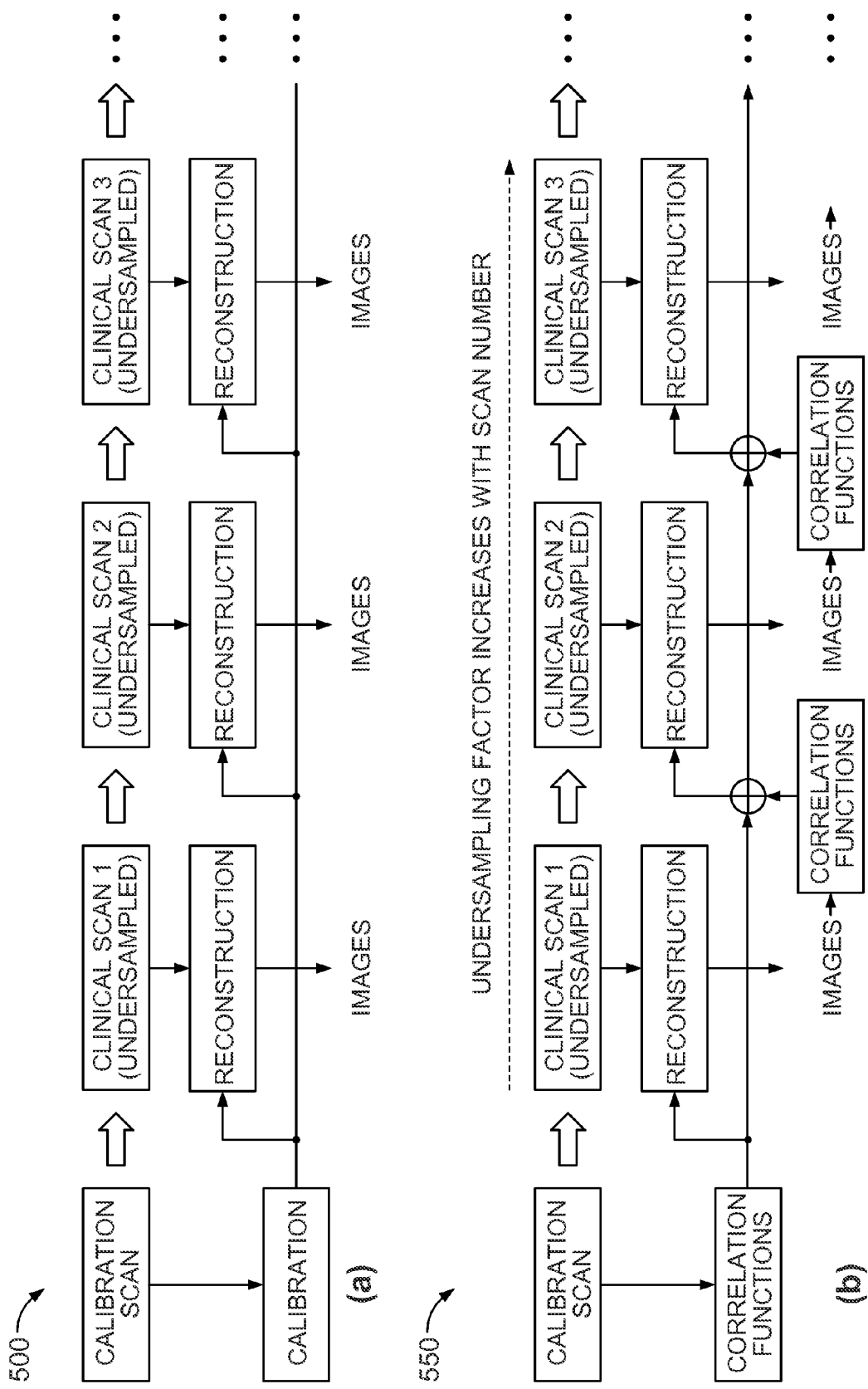
FIG. 5 shows (a) Conventional single-scan optimization strategy with SENSE; (b) Multi-scan optimization strategy using information sharing.

FIG. 5(a) depicts a conventional single-scan optimization strategy 500 with SENSE. FIG. 5(b) depicts a multi-scan optimization strategy 550 using information sharing. FIG. 5(a) illustrates how multi-scan MRI is accelerated using a conventional single-scan optimization strategy with SENSE on clinical MRI scanners. The reconstruction for every scan can be depicted as v=Ua, where "v" is the reconstructed full-FOV image, "U" is the unfolding matrix calculated from the calibration scan, and "a" is the folded image. It should be noted that the unfolding matrix U associated with a previously determined undersampling trajectory depends only on coil sensitivity shared by all the scans. By assembling the reconstruction equations for multi-scan images together, we can form a set of linear equations with the shared unfolding matrix as unknowns and the multi-scan images as the coefficients, providing an approach to finding the optimum reconstruction relationship in the sense of least square error from multi-scan imaging data. It should be noted that since the coefficients of these linear equations are images (not coil sensitivity), the resolved reconstruction relationship will not be equivalent to that in SENSE.

Theory

The data relationship of two sets of k-space imaging data $s_1(k)$ and $s_2(k)$ can be described mathematically using a correlation function given by:

$$c_{ij}(k) = \sum_{all\ k'} d_i(k' + k) \text{conjugate}\{d_j(k')\}, \quad (1)$$

Figure 6:
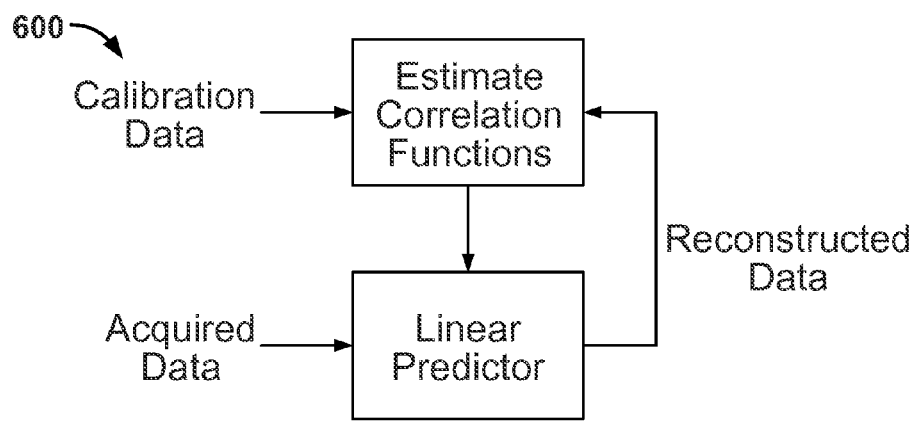
FIG. 6 shows a framework for correlation-based reconstruction.

This mathematical depiction is useful when seeking a solution to the linear predication model shown in previously FIG. 1. FIG. 1 depicts a Linear prediction model 100 for parallel imaging reconstruction. i: channel index; ai(k): acquired data; m(k): real data; ui(k): linear filters for prediction. This model describes parallel imaging reconstruction, if $\{a_i(k), i=1, 2, \ldots, N\}$ represents the undersampled data acquired from an N channel coil array, the linear predictor $\{u_i(k), i=1, 2, \ldots, N\}$ represents the reconstruction in k-space, and m(k) represents the real image data. To minimize the sum of squares error in reconstruction, a solution to the linear predictor can be obtained from a set of linear equations given by:

$$\sum_{i=1}^{N} \left[ C_{a_i a_j}(k) \right] \otimes u_i(k) = C_{m a_j}(k), \quad j = 1, 2, \ldots, N, \quad (2)$$

where $\hat{x}$ represents convolution. It should be noted that the coefficients of the linear equations are determined by the correlation functions (defined by Eq. 1) of acquired data and real data, implying the reconstruction may take advantage of every data relationship that can be mathematically represented by a correlation function. This allows for the use of all available data information in parallel imaging to optimize the reconstruction. FIG. 6 is an illustration of the framework of correlation-based reconstruction 600. FIG. 6 shows the overall framework 600 of correlation-based reconstruction. It can be seen that the reconstruction is iterative: The algorithm is initiated by the estimate of correlation functions from calibration data. The correlation functions are iteratively updated by the calibration data and the data reconstructed from the acquired data using the linear predictor. We used three data relationships for correlation-based reconstruction: 1) neighboring k-space data relationship introduced by coil sensitivities, 2) data correlation between k-space data and their conjugate symmetric data, and 3) data consistency from center and outer k-space data. The first relationship has been used in conventional parallel imaging. The second relationship has been used in partial Fourier imaging and recently in parallel imaging. The third relationship arises from the intrinsic correlation from low- to high-resolution data in a medical image.

FIG. 7(a) shows k-space model 700 for correlation-based reconstruction: Estimate of channel m from all channels. N:

channel number; di(k): data from channel i; ts(k): undersampling trajectory for imaging acceleration; ui(k): linear filter for reconstruction. FIG. 7(b) shows an estimation of correlation functions by ensemble summation over multiple calibration images 702. diI(k): data from channel i in calibration image I.

Figure 7:
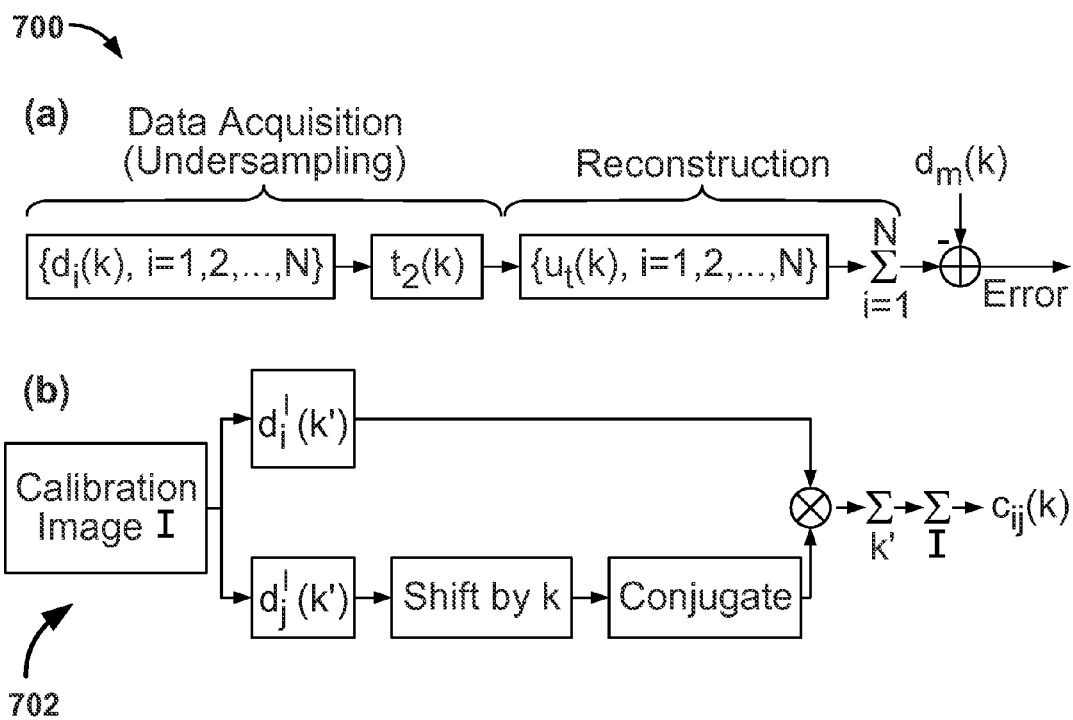
FIG. 7 shows (a) k-space model for correlation-based reconstruction; (b) estimation of correlation functions by ensemble summation over multiple calibration images.

FIG. 7(a) shows the k-space model 700 for correlation-based reconstruction [4]. The least square solution to the linear filters {ui(k), i=1, 2, . . . , N} for reconstruction of an arbitrary channel m in FIG. 7 can be resolved from a set of linear equations given by:

$$\sum_{i=1}^{N} \sum_{all\ k'} c_{ij}(k-k')c_t(k-k')u_i(k') = T_s^*(0)c_{mj}(k), \quad (3)$$

where $c_t(k)$ is the correlation function of a previously determined undersampling trajectory, and cij(k)=sum{[di(k')]•conjuagate[dj(k'+k)]} over k' represents the auto- or cross-channel correlation functions, which can be estimated using the ensemble summation approach shown in FIG. 7(b). This ensemble summation allows for the use of both coil sensitivity information and image content similarity provided by multiple calibration images in correlation-based reconstruction.

Figure 8:
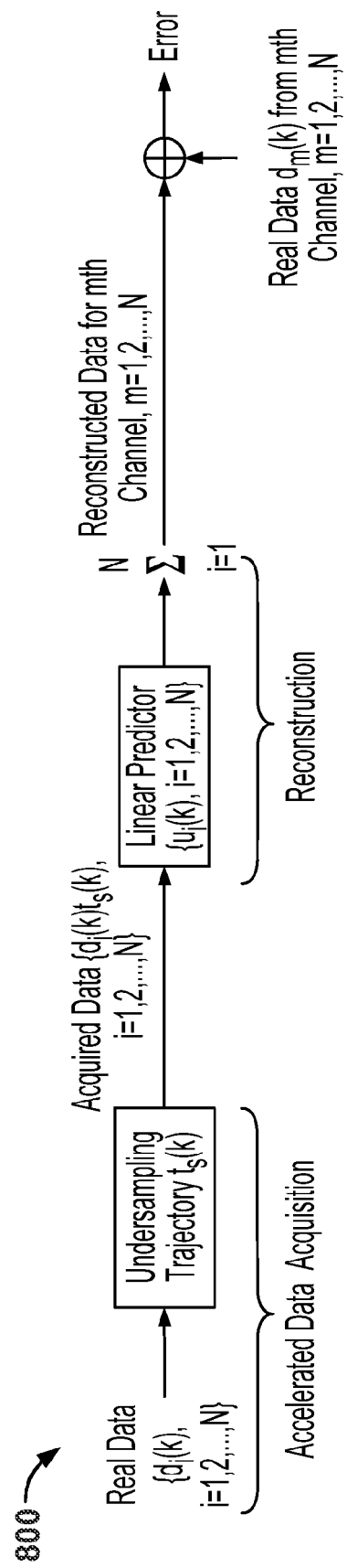
FIG. 8 shows a linear prediction model for high-speed MRI.

FIG. 8 depicts a linear prediction model 800 for high-speed MRI: N is the channel number for parallel data acquisition. The linear predictor 800 includes N sets of k-space filters. The N-channel summation of channel-by-channel linear convolution between the acquired data and the linear predictor gives the reconstructed data.

In correlation imaging, the reconstruction of an arbitrary channel for an arbitrary MRI scan is modeled as a linear prediction from the undersampled data (FIG. 8) in the sense of least square errors. The error function of this linear prediction is given by:

$$\varepsilon = \sum_{all\ \Delta k} \sum_{all\ k} \left| d_m(k) - \sum_{i=1}^{N} \sum_{all\ k'} d_i(k-k')t_s(k-k'-\Delta k)u_i(k') \right|^2, \quad (4)$$

where k and k' are k-space position indexes (2D or 3D vectors), Δk is a linear k-space shift of sampling trajectory in the phase encoding direction and used to account for different starting k-space positions of sampling, N is the channel number, {$d_i(k)$, i=1, 2, . . . , N} are the N-channel imaging data with full Fourier encoding, $t_s(k)$ is the undersampling trajectory for imaging acceleration, and {$u_i(k)$, i=1, 2, . . . , N} represents the linear predictor for reconstruction from undersampled data to the fully-sampled data $d_m(k)$ from channel m. By letting the partial derivative of the error function with respect to the conjugate of each element of the linear predictor be equal to zero, a set of linear equations can be generated for resolving the linear predictor. The equation with respect to the conjugate of an element $u_j(k'')$ is given by:

$$\sum_{i=1}^{N} \sum_{all\ k'} \left[ \sum_{all\ k} d_i(k-k')d_j^*(k-k'') \right. \quad (5)$$

$$\left. \sum_{all\ \Delta k} t_s(k-k'-\Delta k)t_s^*(k-k''-\Delta k) \right] u_i(k') =$$

$$\sum_{all\ k} d_m(k)d_j^*(k-k'') \sum_{all\ \Delta k} t_s^*(k-k''-\Delta k),$$

where superscript * represents conjugate.

As another way of setting forth Eq. 1, the correlation function between two arbitrary channels i and j is described as:

$$c_{ij} = mean\{d_i(k'+k)d_j^*(k')\} \quad (6),$$

And define:

$$c_t(k) = \sum_{all\ k'} t_s(k'+k)t_s^*(k'). \quad (7)$$

By substituting Eqs 6-7 into Eq. 5, we have a set of linear equations with coefficients equal to the correlation functions for resolving the linear predictor in high-speed imaging reconstruction:

$$\sum_{i=1}^{N} \sum_{all\ k'} c_{ij}(k-k')c_t(k-k')u_i(k') = c_{mj}(k) \sum_{all\ k'} t_s(k'), \quad (8)$$

where the indexes j and k are used to count all the elements of the linear predictor. We expect that Eq. 8 can be used to quantify this data correlation by calculating the mean over all the scans and the linear predictor resolved from Eq. 8 can give a generic solution to reconstruction. Such a generic solution to reconstruction physically exists. For example, the unfolding matrix calculated from the calibration scan in SENSE can be used in the reconstruction for all the following scans. In correlation imaging for a clinical MRI protocol, we expect to use Eq. 7 to statistically estimate the correlation functions for the currently running scan from all available aliasing-free images in previous scans. The estimated correlation functions are used to form Eq. 8 for resolving the linear predictor to reconstruct images in the current scan based on information sharing of all available imaging data.

Practically, it is preferred to transform Eq. 8 to image space as the image-space multiplication gives better computation efficiency than k-space convolution when the data size is large. By inverse Fourier Transform, the image-space equations for resolving the linear predictor are given by:

$$\sum_{i=1}^{N} \left[ \sum_{all\ r'} C_{ij}(r-r')C_t(r') \right] U_i(r) = T_s^*(0)C_{mj}(r), \quad (9)$$

$$j = 1, 2, \ldots, N$$

where r is the spatial location in image space (2D or 3D vectors), $C_t(r)$ is spectrum of the point spread function of the undersampling trajectory, $C_{ij}(r)$ is the inverse Fourier transform of the correlation function between channel i and j, and $U_i(r)$ is the inverse Fourier transform of the linear predictor for channel i. Equations 6-8 form the framework of correlation imaging in both k- and image-space. In this framework, auto or cross correlation functions for all channels are first estimated from all available imaging data based on Eq. 7. The resolved linear predictor from Eq. 8 or 9 is then applied directly to the undersampled data for reconstruction either by k-space convolution (Eq. 8) or by image-space multiplication (Eq. 9).

The image-space representation of the correlation function $C_{ij}(r)$ is called "image spectrum". It is equivalent to the concept of power spectrum in the field of signal processing. Correlation imaging links the power spectral estimate to the image reconstruction from undersampled data, and drives the high-speed MRI techniques found in this disclosure.

The framework of correlation imaging includes a statistical concept of "correlation function" and a mathematical model that converts the image reconstruction to the estimation of correlation functions in high-speed MRI. As correlation functions statistically quantify the shared information across images, this framework provides a link between high-speed MRI and information sharing across images acquired from multiple scans in a clinical MRI protocol.

Figure 9B:
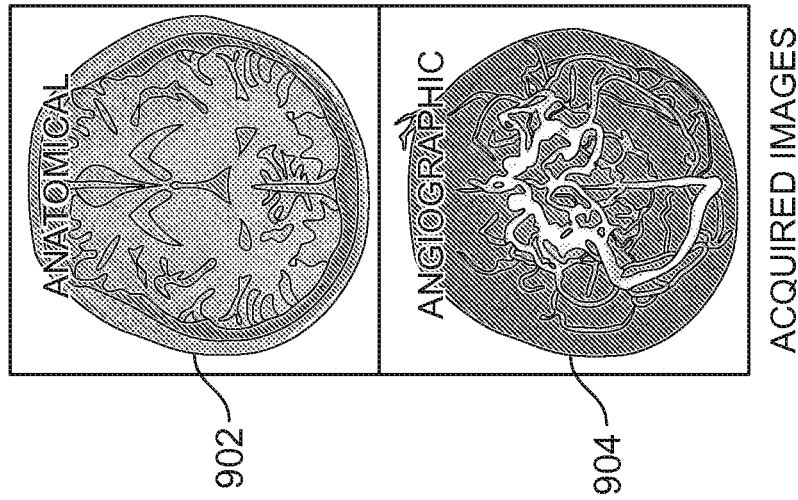
FIG. 9 shows show brain images and its data; (a) shows an 8-channel head coil array layout; (b) depicts brain images (anatomical and angiographic); (c) depicts several examples of correlation functions calculated from these images (c11, c'11, c12, c15 for channels 1, 2 and 5); and (d) shows a projection of the correlation functions along the dotted lines in 2D figures.
Figure 9A:
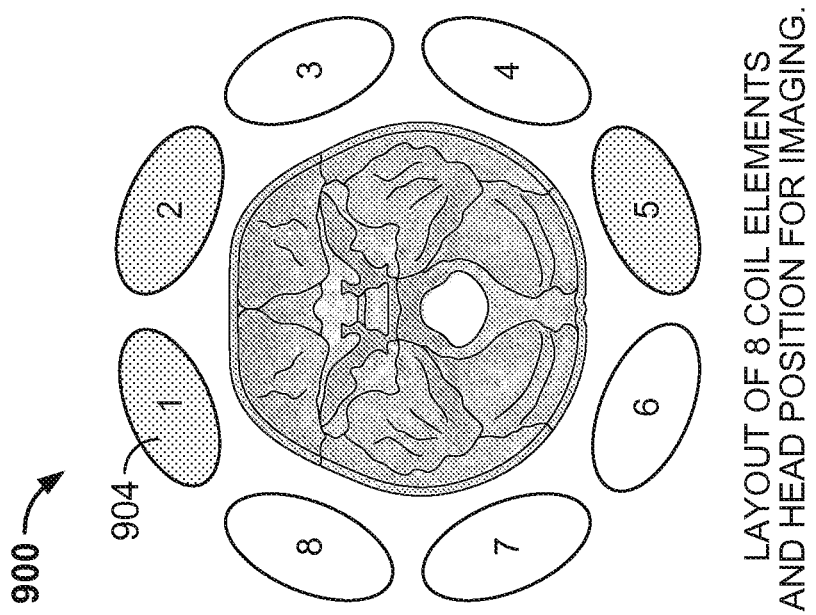
Figure 9C:
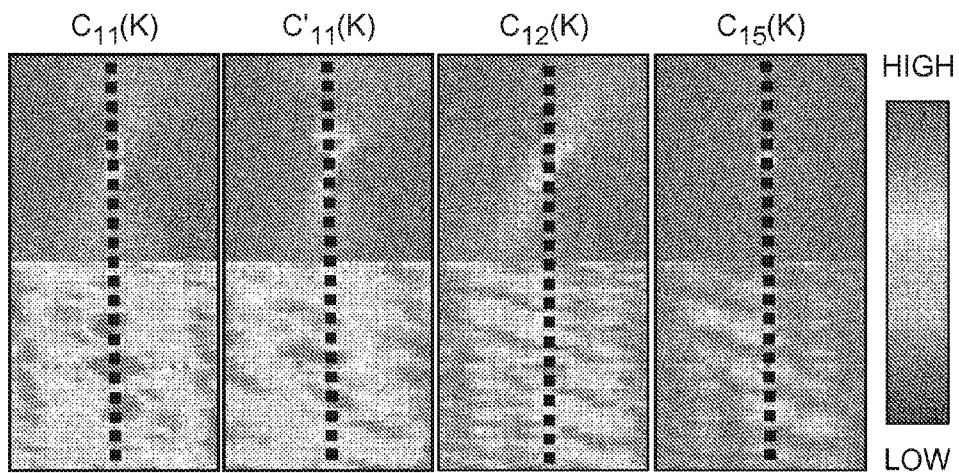
Figure 9D:
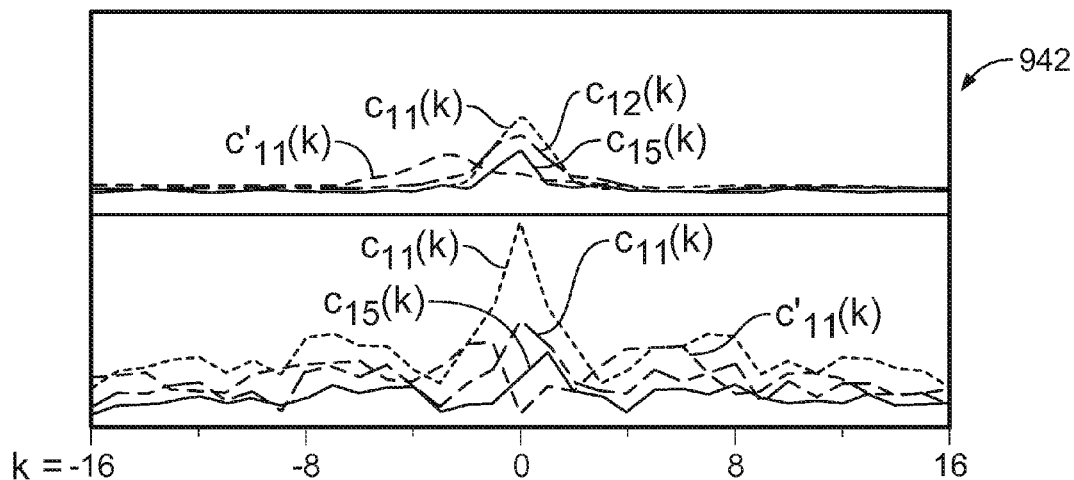

The correlation function cij(k) calculated by Eq. 7 quantifies the statistical correlation of data samples in a distance of k in k-space between the ith and jth channels. This correlation is determined by multiple mechanisms underlying data acquisition. FIG. 9(a)-FIG. 9(d) show the brain images 900 (anatomical 902 and angiographic 904) acquired with an 8-channel head coil array 904 and several examples of correlation functions 930 calculated from these images (c11, c'11, c12, c15 for channels 1, 2 and 5). The correlation function projections 942 are shown in FIG. 9(d). These correlation functions quantify data correlation related to the following 5 mechanisms:

1) In multi-channel data acquisition, coil sensitivity introduces neighboring k-space data correlation. As a result, the correlation functions (c11, c'11, c12, c15) give high values when k is small (close in k-space) and decay with k.

2) Auto-channel correlation (c11) is always the highest because coil sensitivity and image information are the same.

3) Cross-channel correlation exists because image information is the same and coil sensitivity may overlap in image space. This correlation is higher between two neighboring channels than between two channels far away from each other (c12>c15) because the physically closer channels have more overlap in coil sensitivity.

4) The original data and their conjugate symmetric data with respect to the k-space origin are also correlated (e.g. c'11) because the image magnitude usually dominates the image phase and k-space data are nearly conjugate symmetric.

5) Angiographic images are sparse in image space providing k-space data correlation higher than anatomical images. This data scarcity implies that less image aliasing will be generated if k-space data is undersampled in high-speed MRI.

The estimation of correlation functions plays a key role in the framework of correlation imaging. Multiple approaches exist to implement Eq. 7 for the statistical characterization of data correlation underlying multi-scan and multi-channel MRI imaging. For the demonstration of feasibility, the presented work uses an approach based on a classical power spectral estimate "periodogram" in the field of signal processing.

Practical Approach to Estimating Correlation Functions

The multi-scan data acquisition from each channel is considered as a random process. Each image is a sample of the random process. The mean calculation in Eq. 6 can be equivalently implemented by ensemble summation of k-space averaging from every finite-length image sample previously acquired or reconstructed in multi-scan imaging. This approach to estimating the correlation function of k-space data from channels i and j can be described as:

$$c_{d_i d_j}(k) = \sum_{I \in \text{previous images}} \left\{ \frac{1}{M^I - |k|} \sum_{-M^I/2 \leq k', k'+k \leq M^I/2-1} [d_i^I(k+k')][d_j^I(k')]^{conj} \right\}, \quad (10)$$

where $d_i^I(k)$ and $d_j^I(k)$ are the data from channel i and j in a previous image I with a data length of $M^I$ ($-M^I/2 \leq k \leq M^I/2-1$) in k space. Equation 10 shows only the 1D representation for better visualization. The 2D and 3D representations can be derived with trivial effort by adding dimensions for summation in k-space averaging. It should be noted that this equation allows for the use of images with different resolution (data length $M^I$ can be different for different I).

Intrinsic Gain in Resolution from the Estimation of Correlation Functions

Equation 10 increases the data length from M in the acquired data to 2M-1 in the estimated correlation functions implying the spatial resolution is improved by a factor (2M-1)/M. This provides a simple approach to k-space data extrapolation from low- to high-resolution data. Because this extrapolation is intrinsically given by the estimate of correlation functions, correlation imaging naturally offers a gain in resolution.

Selection of Multiple Images

The images used in Eq. 10 for ensemble summation can be selected from those previously acquired or reconstructed in clinical MRI scans of the same subject. The best candidates are those from the same location where the current imaging data are acquired as they share the most information about coil sensitivity and anatomical structure. The images from around locations can also be used (see the sections of "results" and "discussion"). Accordingly, we have a number of choices to provide data samples for Eq. 10. The use of a large number of data samples in Eq. 10 can effectively reduce the sensitivity of the statistical estimation of correlation functions to the unpredictable varying information across images acquired in different scans.

Conjugate Symmetry of k-Space Data

The current disclosure provides that correlation imaging can use information beyond coil sensitivity thereby providing an approach to overcoming the speed limit posed by an RF coil array in high-speed MRI. As an example for demonstration, the presented framework includes a mechanism that has been used in partial Fourier imaging and recently in parallel imaging: Most MRI images (without coil sensitivity) are nearly conjugate symmetric in k-space because they do not have much phase information. As in the virtual coil concept for parallel imaging, we introduce additional channels using the k-space conjugate symmetric versions of the acquired data in the linear prediction model 800 given by FIG. 8. Correspondingly, correlation functions of both the original data and their k-space conjugate symmetric data will be estimated using Eq. 10.

Practical Implementation

The current disclosure demonstrates correlation imaging speeds up clinical MRI by utilizing shared information across images acquired with different contrast or resolution in different scans. With respect to geometry difference across images, this issue can be resolved by image registration established in other studies, e.g., fMRI post-processing techniques for the registration of anatomical and functional images. Thus, the imaging data are acquired with the same geometry parameters (e.g., slice orientation, FOV, . . . etc.).

In the experiments, the data are fully sampled in data acquisition. The partial Fourier encoding data for high-speed imaging are generated by artificial undersampling in the phase or the slice encoding direction during post-processing. The images reconstructed directly from the fully sampled data are used as a reference. Channel-by-channel reconstruction is used. The reconstruction algorithms for correlation imaging are implemented in MATLAB® (MathWorks Inc., Natick, Mass.). Because pixel-wise multiplication in image space is computation-efficient, image-space reconstruction (Eq. 9) is used.

In the presentation of our results, an error image is the difference image between the reconstructed and reference images. The RSS error is defined as the square Root of the Sum of Squares (RSS) of the error image. This error is normalized with respect to the reference image, i.e., the RSS error represents the ratio of the RSS of the error image to that of the reference image in percentage.

Figure 10:
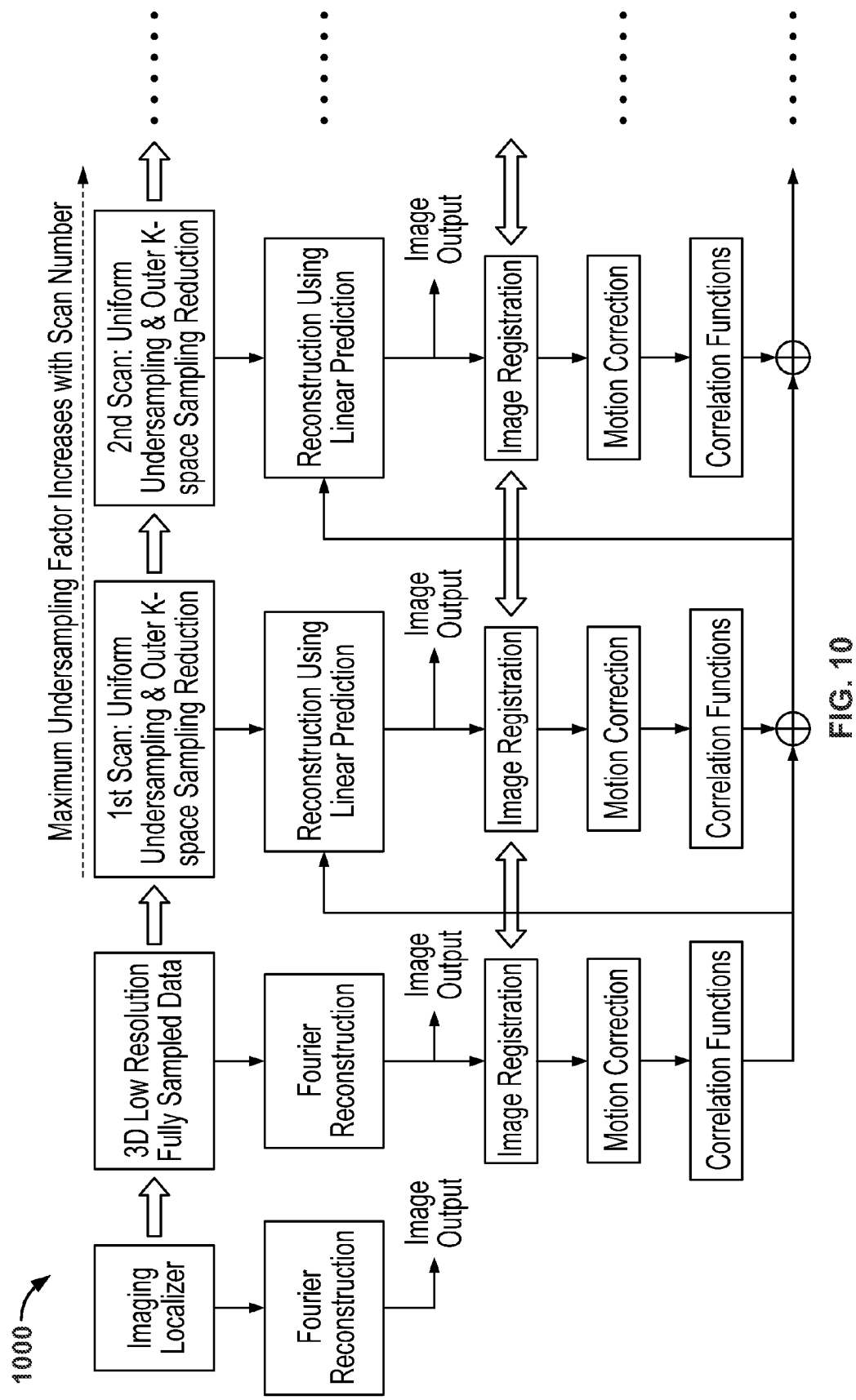
FIG. 10 shows a flow chart of correlation imaging for a clinical MRI protocol that includes multiple scans.

FIG. 10 shows a flow chart 1000 of correlation imaging for a clinical MRI protocol that includes multiple scans. Correlation functions may be updated immediately after the completion of each scan. The maximum undersampling factor allowed for each scan may increase with data acquisition. The double directional arrows indicate the reference across scans in image registration.

Results

Correlation imaging can use information sharing across scans to speed up multi-scan and multi-channel imaging in a clinical MRI protocol. Because this shared information can be either from coil sensitivity or anatomical structure, the speed in correlation imaging is not limited by the spatial encoding capability of RF coil arrays.

Gain of Resolution from the Estimation of Correlation Functions

Figure 11:
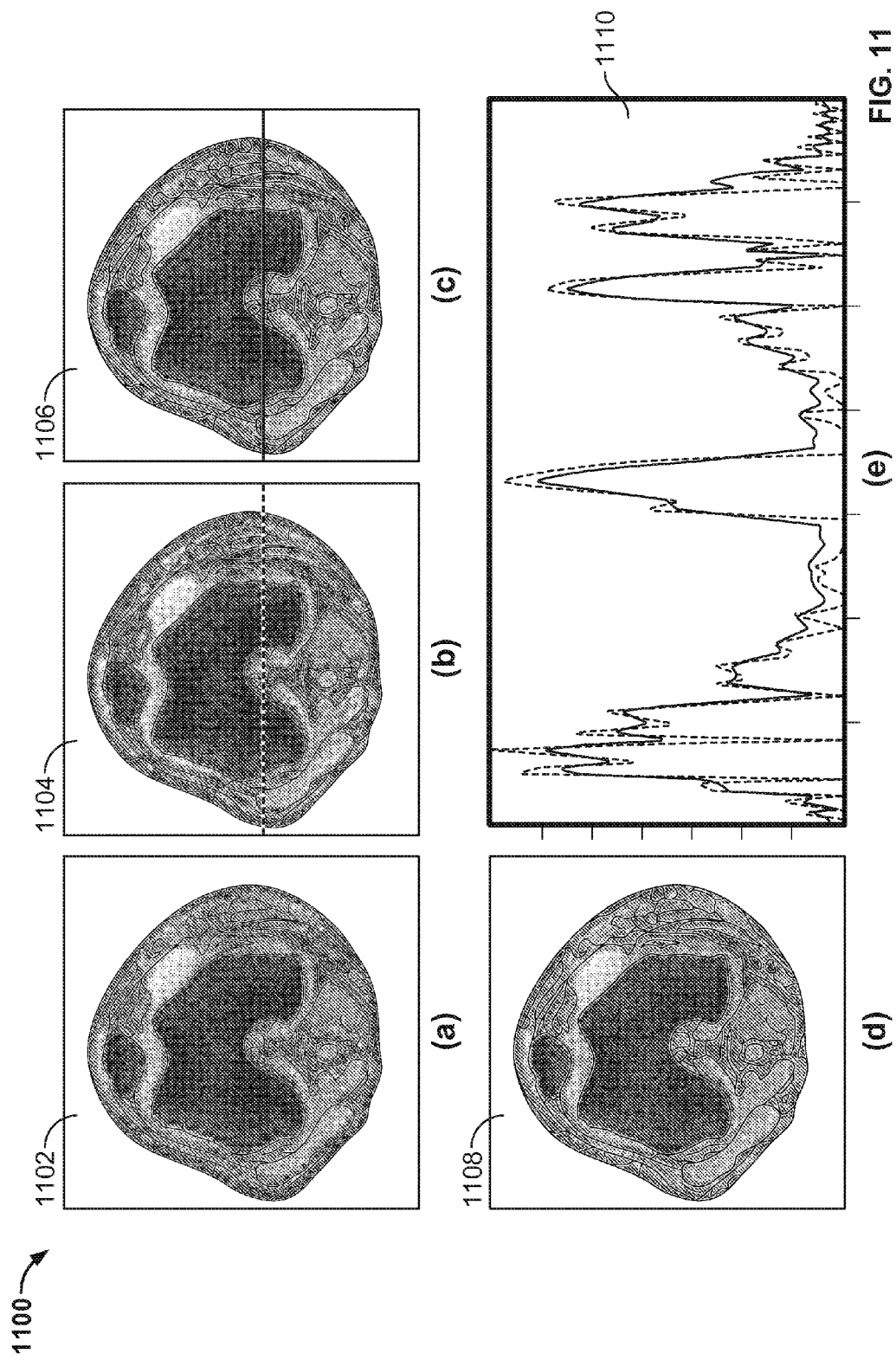
FIG. 11 shows (a) low resolution knee image; (b) image spectrum: inverse Fourier transform of estimated correlation functions; (c) image from the data in (a) with zero-padding; (d) High resolution knee image; and (e) intensity plot along the projection lines in (b) and (c)

Knee imaging data demonstrates the gain of resolution from the estimation of correlation functions because resolution is crucial to the diagnostic quality of knee images 1100 in FIG. 11(a)-(d), e.g., measurements of articular cartilage using segmentation. The acquired 8-channel low-resolution images are used for ensemble summation in Eq. 10. Compared with the direct sum of square images (FIG. 11(a)) 1102, the image spectrum (FIG. 11(b)) 1104 gives a gain in resolution and the reference image (FIG. 11(d)) 1108 confirms the fidelity of this resolution gain. FIG. 11(c) 1106 shows the image generated by zero-padding the low-resolution data to the same size of estimated correlation functions. The generation of images of the same size allows illustrating the resolution gain from correlation functions more clearly (FIG. 11(e)) 1110 using the 2D intensity projection plots along the dashed and solid lines in 1104 and 1106. This resolution gain intrinsically from correlation functions is useful for those imaging applications where only magnitude information is important. In correlation imaging, the estimated correlation functions give higher resolution than the original data thereby implicitly providing a gain of resolution for reconstruction using the linear predictor calculated from those correlation functions. This is because data extrapolation using Eq. 10 produces non-zero data (statistically estimated) in outer k-space (>64).

The data acquisition were knee imaging experiments conducted on a 3.0 T clinical MRI system with a volume transmit/8-channel receive coil. Axial images were collected using a T2-weighted 2D gradient echo sequence (FOV 160×160 mm, phase encoding direction left-right, TR/TE 419/12 ms, flip angle 20 degrees, 24 slices with 2 mm slice thickness and 1 mm gap). Two sets of data were acquired respectively with low-resolution (matrix 64×64) and high-resolution (matrix 256×256). The results in reference to high resolution (256× 256) knee image, the Inverse Fourier transform of correlation functions (127×127) estimated from low resolution knee imaging data (64×64) gives higher resolution than the original low-resolution image or the zero-padding image (127× 127) (observable in both images and projection plots) because Eq. 6 offers data extrapolation that produces non-zero data (statistically estimated) in outer k-space (>64). The conclusion is, this allows for the reconstruction of high-resolution images from center k-space data in correlation imaging thereby providing the potential to further accelerate imaging by outer k-space sampling reduction.

Figure 12:
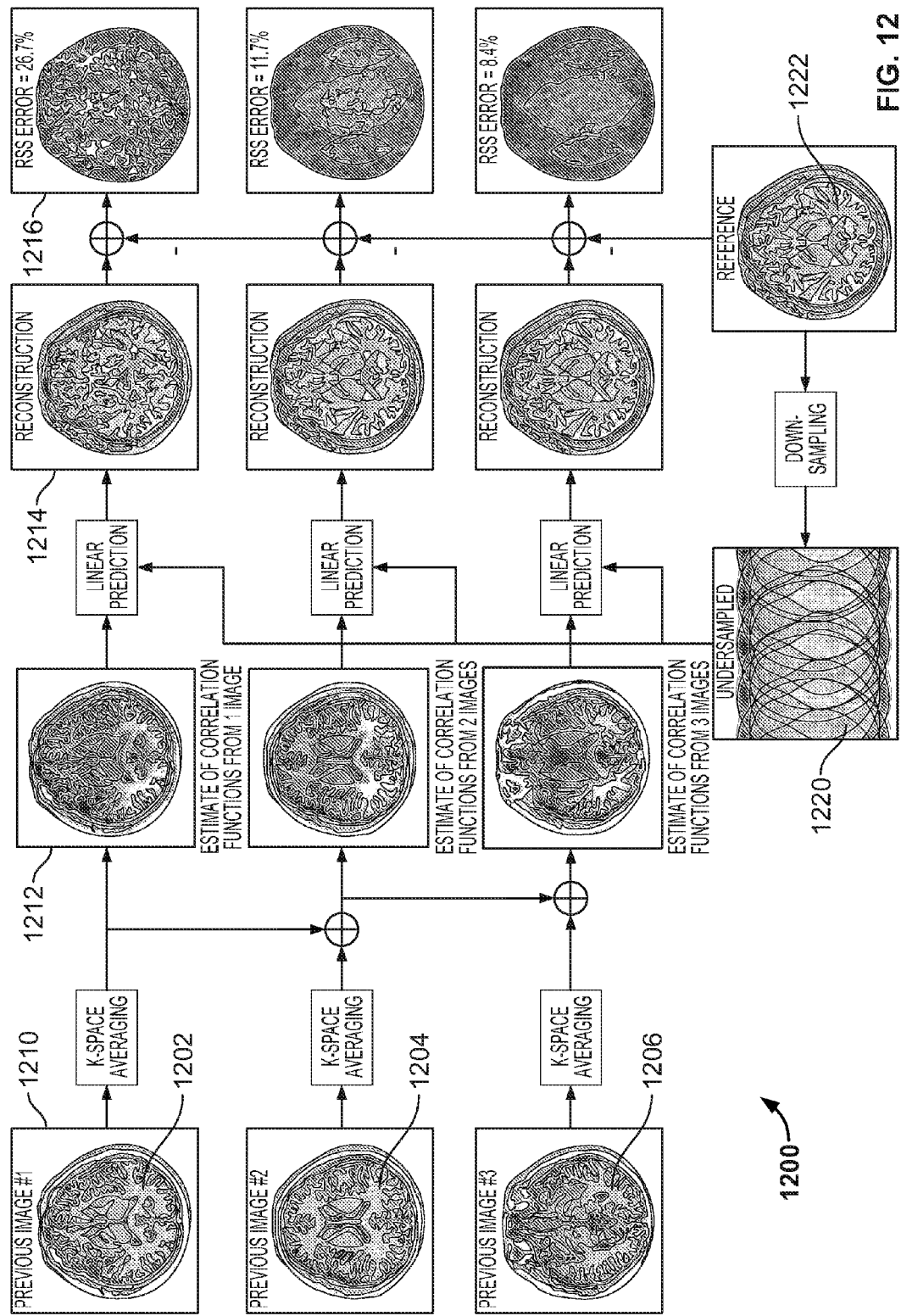
FIG. 12 shows suppression of contrast-related artifacts by estimating correlation functions from multiple images.

Suppression of Contrast-Related Artifacts by Estimating Correlation Functions from Multiple Images Correlation imaging uses multiple images that can provide a large number of data samples for the estimation of correlation functions at each k-space location (Number of data samples at k=sum of [$M^I$−|k|] over all previous images in Eq. 10). If the number of data samples is not sufficient, artifacts may be generated in reconstruction as correlation functions may bring the image contrast difference into the reconstruction. FIG. 12 shows an example 1200 using brain imaging data acquired from two scans with different contrast. FIG. 12 shows suppression of contrast-related artifacts by estimating correlation functions from multiple images using Eq. 10. In this brain imaging experiment, two scans were performed with different contrast. The reference image from the second scan was post-processed by down-sampling with a factor of 4. Correlation functions were estimated from the previous images #1, #2 and #3 1210 acquired in the first scan. Notice they have different contrast from the reference image 1222. By ensemble summation of k-space averaging over more images around the location where the reference image is acquired, the image contrast information in the first scan becomes less and less in the estimated correlation functions 1212 providing an effective approach to suppressing the contrast-related artifacts in the linear prediction. This suppression can be seen in reconstructed images 1214, error images 1216, and the RSS errors. Using all three previous images, a high-quality image can be reconstructed (RSS error ~8.4%). To reconstruct an image in the second scan (Reference image 1222 in FIG. 12), we can select the image (Previous image #1 1202 in FIG. 12) acquired at the same location in the first scan to estimate correlation functions. This is a desired choice as this image provides the exact coil sensitivity information needed for the reconstruction. However, if only this image is used in Eq. 10, the reconstruction gives strong artifacts that relate to the contrast difference between two scans. This is because the number of data samples for ensemble summation is not sufficiently large for suppressing the contrast difference interference. To resolve this issue, use the images previously acquired not only at the location where the current imaging data are acquired but also their neighbors, i.e., the slices below and above the image to be reconstructed (Previous image #2 1204 and #3 1206 in FIG. 12). As demonstrated, by using more images to estimate the correlation functions, the contrast-related artifacts can be effectively suppressed. If all three previous images are used in the ensemble summation, a high-quality image can be reconstructed from the data undersampled 1220 by a factor of 4.

Figure 13:
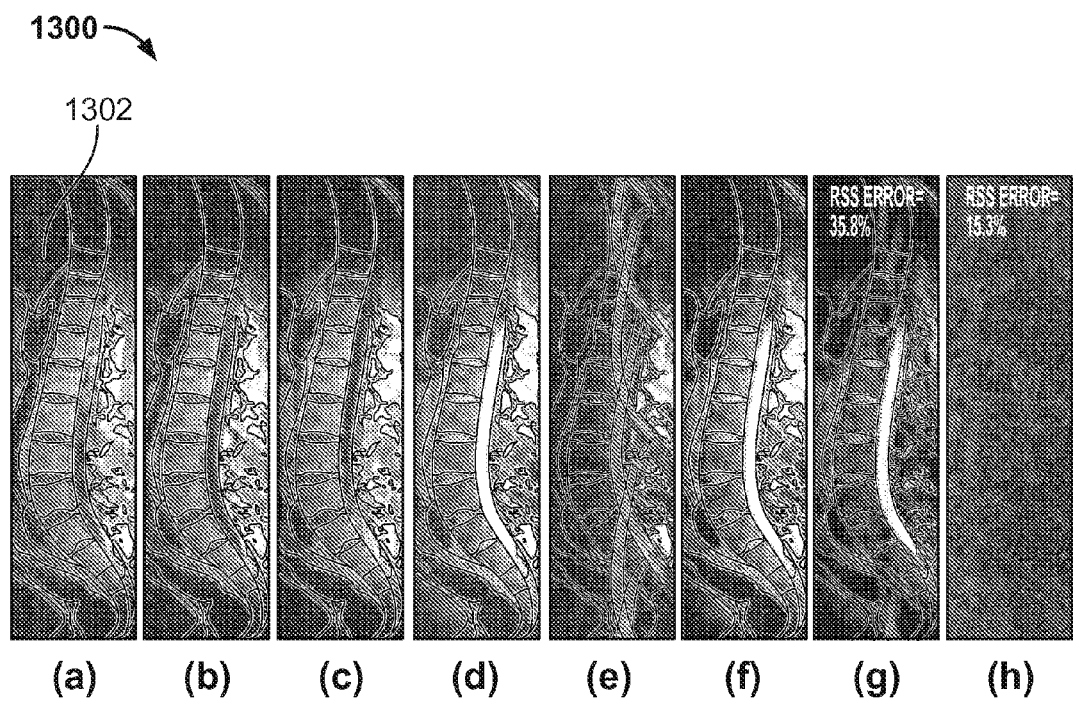
FIG. 13 shows images from an experiment in spine imaging.

To verify whether the selection of images at different locations for the estimation of correlation functions is suitable for other applications, the experiment shown in FIG. 12 is repeated using spine imaging data. The slice position offset is intentionally by 3 mm in the second scan relative to the first scan, implying the reconstruction is more challenging as it is not even the imaging data exactly from the location of the image to be reconstructed. As shown in FIG. 13, the results from spine imaging confirm what is demonstrated in FIG. 12 with brain imaging data.

FIG. 13 shows an experiment 1300 in spine imaging 1302: Correlation functions can be estimated from multiple images acquired previously around the location of the image to be reconstructed FIG. 13 (a)-(c) Three previous images acquired close (FIG. 13 (b) is the closest) to the location of the image to be reconstructed. FIG. 13(d) The image to be reconstructed. Notice the contrast is different from that in FIG. 13(a)-(c). FIG. 13(e) Correlation imaging using only one image FIG. 13(b) to estimate correlation functions. FIG. 13(f) Correlation imaging using all three images FIG. 13(a)-(c) to estimate correlation functions. FIG. 13(g)-(h) Error images for the reconstruction of FIG. 13(e) and FIG. 13(f).

Figure 14:
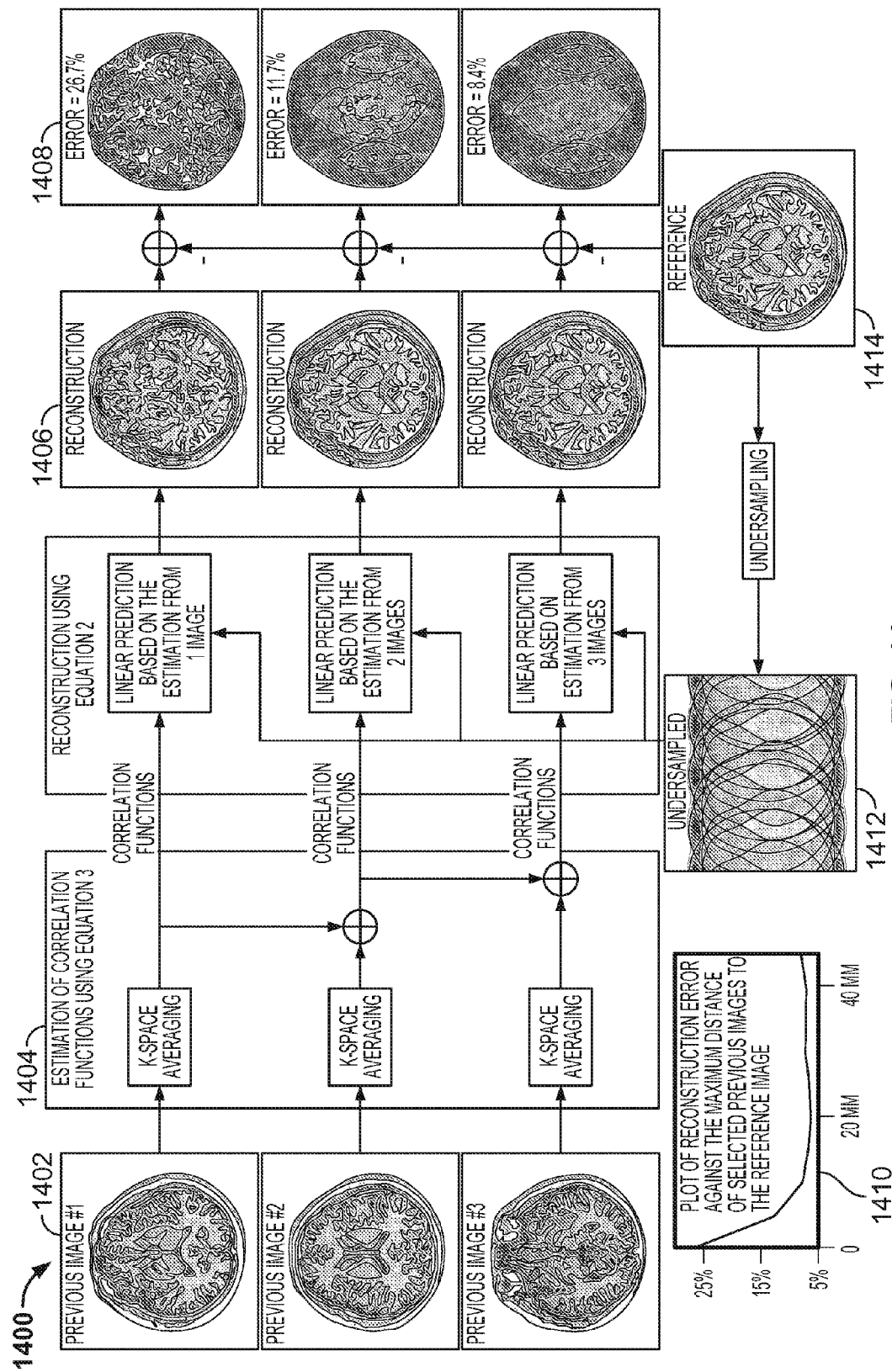
FIG. 14 shows ensemble summation effectively suppressing random image variation in the estimation of correlation functions, and reducing reconstruction artifacts.

FIG. 14 shows ensemble summation 1400 in Eq. 10 can effectively suppress random image variation in the estimation of correlation functions reducing reconstruction artifacts associated with this random variation. Data acquisition of brain imaging data was collected on a 3.0 T clinical MRI scanner using an 8-channel head coil array. An inversion recovery sequence with two different inversion recovery was used in two consecutive scans. An image (reference 1414) from the second scan was undersampled 1412 for reconstruction. Correlation functions 1404 were estimated from multiple images in the first scan (previous images 1402) around the location of the reference image. The previous images have different contrast from the image to be reconstructed (reference) 1406.

The result was that reconstruction artifacts related to the contrast or anatomical structure difference can be seen if only one image is used in Eq. 10 for the estimation of correlation functions. These artifacts and reconstruction errors 1408 can be reduced by increasing the number of previous images. Only the use of those images with similarity to the "reference" image in coil sensitivity and anatomical structure (sufficiently close in distance) can lead to this reduction while those images far away cannot considerably affect the reconstruction (The reconstruction error plot 1410 is flat when the maximum distance of the previous images to the reference image>10 mm).

Performance Test on Generic Utility in Reference to SENSE and GRAPPA

A performance test of correlation imaging (without k-space conjugate symmetry mechanism) in reference to SENSE and GRAPPA with 24 ACS lines for calibration using brain and spine imaging data was performed. This comparison is not for evaluating or comparing different techniques, as these techniques use different data for calibration. SENSE and GRAPPA were used as a gold standard to investigate whether correlation imaging gives sensible results in the presented experiments. The comparable reconstruction errors in Table 1 demonstrate that correlation imaging is suitable for generic MRI.

TABLE 1

The performance of correlation imaging is evaluated using brain and spine imaging data acquired from two scans in reference to standard SENSE and GRAPPA. Conjugate symmetry mechanism is not used in this test. The correlation functions are estimated from the data fully sampled in the first scan. The data acquired from the second scan are reconstructed with an acceleration factor R = 2, 3, and 4. SENSE and GRAPPA use 24 ACS lines for calibration in the second scan. The reconstruction shows comparable RSS errors (%) demonstrating the suitability of correlation imaging for generic MRI.

|       |       |             | SLICE # |      |      |      |      |      |      |      |      |      |           |
|-------|-------|-------------|------|------|------|------|------|------|------|------|------|------|----------------|
|       |       |             | 1    | 2    | 3    | 4    | 5    | 6    | 7    | 8    | 9    | 10   | TOTAL*         |
| Brain | R = 2 | SENSE       | 4.3  | 4.2  | 3.9  | 4.2  | 3.1  | 3.8  | 3.7  | 3.9  | 4.1  | 3.0  | 3.8 ± 0.4      |
|       |       | GRAPPA      | 3.5  | 3.7  | 3.2  | 2.9  | 2.8  | 3.1  | 3.0  | 2.8  | 3.6  | 3.2  | 3.2 ± 0.3      |
|       |       | Correlation | 4.2  | 3.1  | 3.0  | 3.2  | 3.3  | 3.2  | 3.3  | 3.2  | 4.3  | 5.2  | 3.6 ± 0.7      |
|       | R = 3 | SENSE       | 6.0  | 6.7  | 5.2  | 6.3  | 5.9  | 6.9  | 6.6  | 5.8  | 6.2  | 5.9  | 6.2 ± 0.5      |
|       |       | GRAPPA      | 5.3  | 5.2  | 4.9  | 5.0  | 5.1  | 4.8  | 5.3  | 4.9  | 5.2  | 5.1  | 5.1 ± 0.2      |
|       |       | Correlation | 5.7  | 4.7  | 4.5  | 4.7  | 4.8  | 5.0  | 5.0  | 5.6  | 6.1  | 6.5  | 5.3 ± 0.7      |
|       | R = 4 | SENSE       | 9.8  | 10.0 | 8.9  | 9.2  | 8.8  | 9.2  | 9.3  | 8.6  | 9.3  | 8.0  | 9.1 ± 0.6      |
|       |       | GRAPPA      | 7.8  | 7.2  | 7.5  | 7.8  | 8.1  | 7.3  | 7.1  | 7.6  | 7.5  | 7.9  | 7.5 ± 0.3      |
|       |       | Correlation | 8.1  | 7.3  | 7.1  | 7.3  | 7.7  | 7.9  | 7.2  | 7.3  | 8.3  | 9.2  | 7.7 ± 0.7      |
| Spine | R = 2 | SENSE       | 9.6  | 8.8  | 9.1  | 8.7  | 9.3  | 9.8  | 10.1 | 8.6  | 7.8  | 8.2  | 9.0 ± 0.7      |
|       |       | GRAPPA      | 9.1  | 8.2  | 7.6  | 7.9  | 8.3  | 8.6  | 7.6  | 7.5  | 8.2  | 8.9  | 8.2 ± 0.6      |
|       |       | Correlation | 9.9  | 8.7  | 8.0  | 7.9  | 7.8  | 8.2  | 7.3  | 9.2  | 9.3  | 9.2  | 8.6 ± 0.8      |
|       | R = 3 | SENSE       | 12.8 | 10.5 | 10.3 | 9.9  | 10.8 | 11.2 | 12.3 | 10.6 | 9.5  | 8.9  | 10.7 ± 1.2     |
|       |       | GRAPPA      | 10.2 | 9.1  | 8.9  | 8.8  | 10.0 | 10.2 | 9.1  | 10.9 | 10.3 | 10.8 | 9.8 ± 0.8      |
|       |       | Correlation | 10.7 | 9.7  | 9.5  | 9.3  | 9.2  | 8.9  | 8.0  | 9.6  | 10.1 | 10.5 | 9.6 ± 0.8      |
|       | R = 4 | SENSE       | 15.2 | 13.0 | 13.8 | 13.1 | 12.9 | 13.2 | 16.7 | 12.9 | 11.3 | 10.8 | 13.3 ± 1.7     |
|       |       | GRAPPA      | 12.8 | 10.2 | 11.8 | 13.2 | 11.9 | 12.8 | 10.5 | 13.5 | 12.6 | 12.7 | 12.2 ± 1.1     |
|       |       | Correlation | 13.1 | 12.3 | 12.1 | 13.3 | 12.0 | 11.9 | 11.2 | 12.7 | 12.9 | 13.2 | 12.5 ± 0.7     |

*Total error is the "Mean ± Standard deviation" calculated over the errors of all slices.

Figure 15:
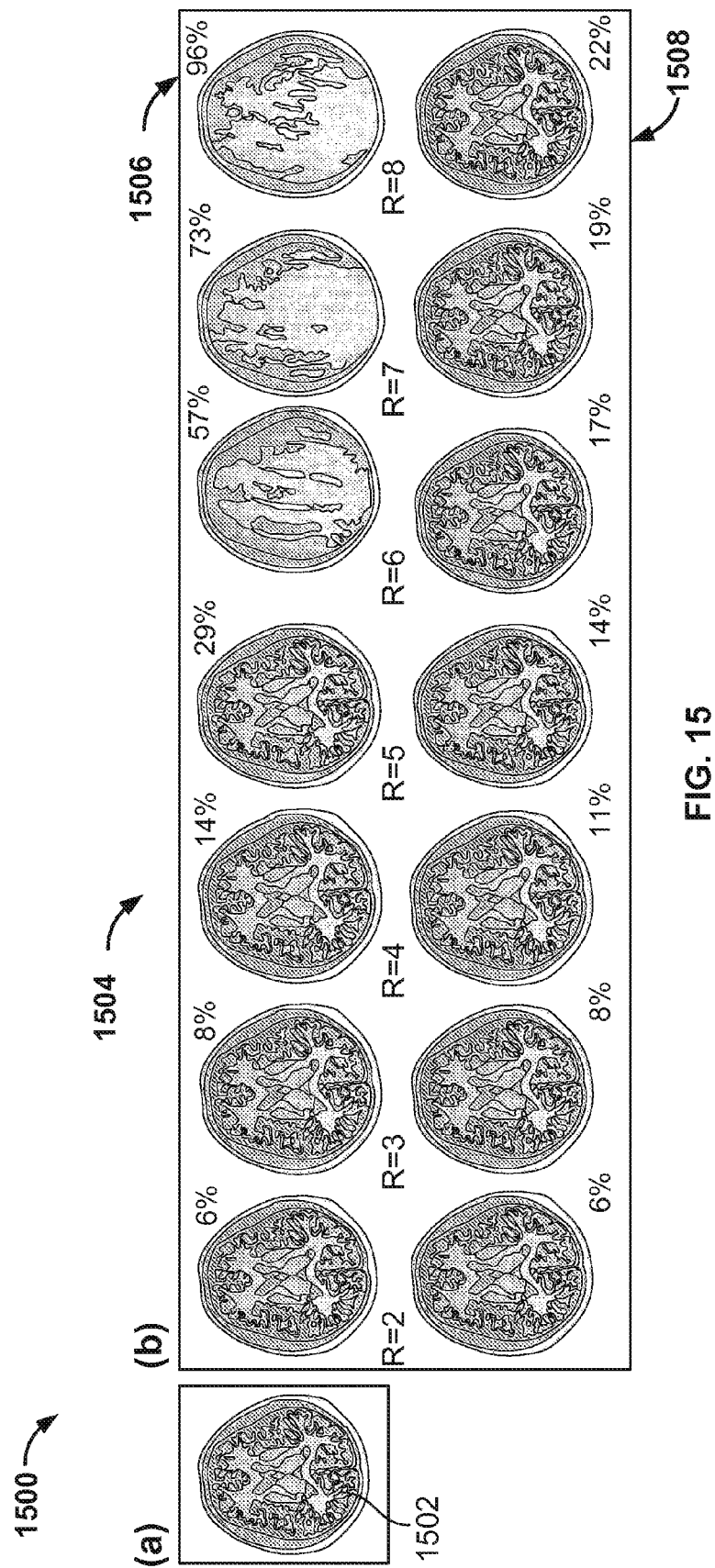
FIG. 15 shows a comparison of parallel imaging performance between GRAPPA and correlation-based reconstruction in high-resolution brain imaging.

FIG. 15 shows a comparison 1500 of parallel imaging performance between GRAPPA and correlation-based reconstruction in high-resolution brain imaging. FIG. 15(a) is reference image 1502 from fully sampled data. FIG. 15(b) shows reconstructed images 1504 using GRAPPA (top row 1506) and correlation-based reconstruction (bottom row 1508) with reduction factors R=2, 3, . . . , 8. The percentage numbers are RMSEs relative to the reference image.

The head coil array used in this work has eight elements uniformly placed around the head anatomy and the number of elements in any direction is at most 4. As a result, the imaging acceleration using a conventional parallel imaging technique is limited by this factor due to its complete dependence on coil sensitivities. In FIG. 15, it can be seen that GRAPPA performs well when R≤4. However, this conventional reconstruction technique gives strong aliasing artifacts when R>4 indicating the spatial encoding of coil sensitivities is not sufficient. Compared with GRAPPA, correlation-based reconstruction performs very well with all reduction factors from 2 to 8, indicating this framework offers imaging acceleration capability beyond the limit posed by the coil array. This improved parallel imaging performance can also be seen quantitatively from the calculated Root-Mean-Squared Errors (RMSE) shown in FIG. 15.

Overcoming the Speed Limit Posed by RF Coil Arrays

Figure 16:
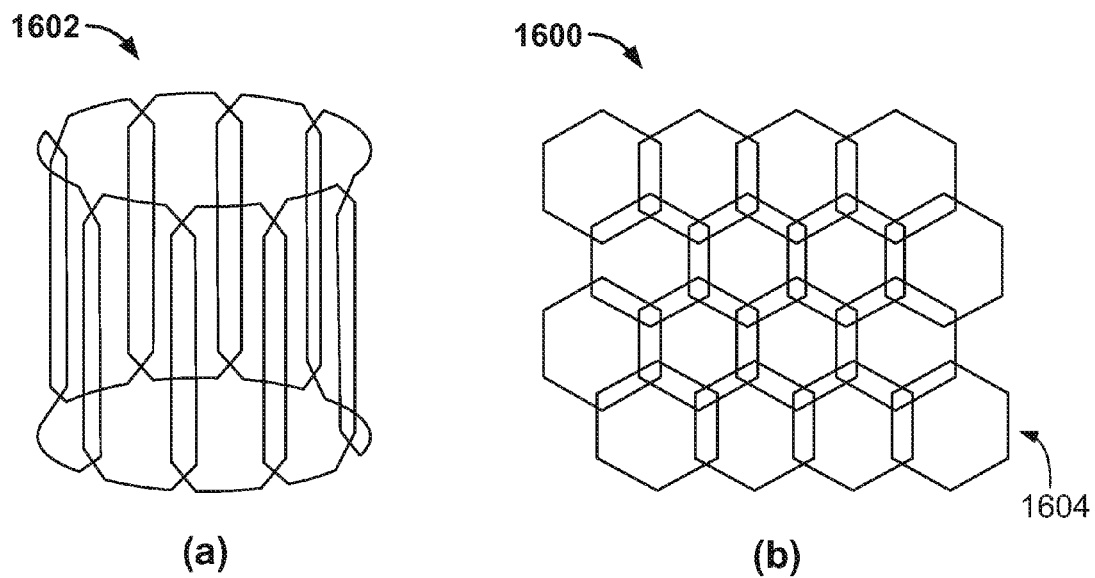
FIG. 16 shows a coil layout for brain, knee and spine imaging: (a) Circular geometry for 8-channel head and knee coil array; (b) Planar geometry for 16-channel body coil array.

Brain, spine and knee imaging data were acquired using coil arrays with element layouts shown in FIG. 16. FIG. 16 shows the coil layout for brain, knee and spine imaging. FIG. 16(*a*) shows the circular geometry 1602 for 8-channel head and knee coil array, and FIG. 16(*b*) shows the planar geometry 1604 for 16-channel body coil array. The head and knee coils both have circular geometry (FIG. 16(*a*)). The body coil array for spine imaging has planar geometry (FIG. 16(*b*)). Every coil array has at most 4 coil elements in an arbitrary direction implying the acceleration factor will be limited by 4 if high-speed MRI is dependent only on the spatial encoding of coil sensitivity.

Figure 17:
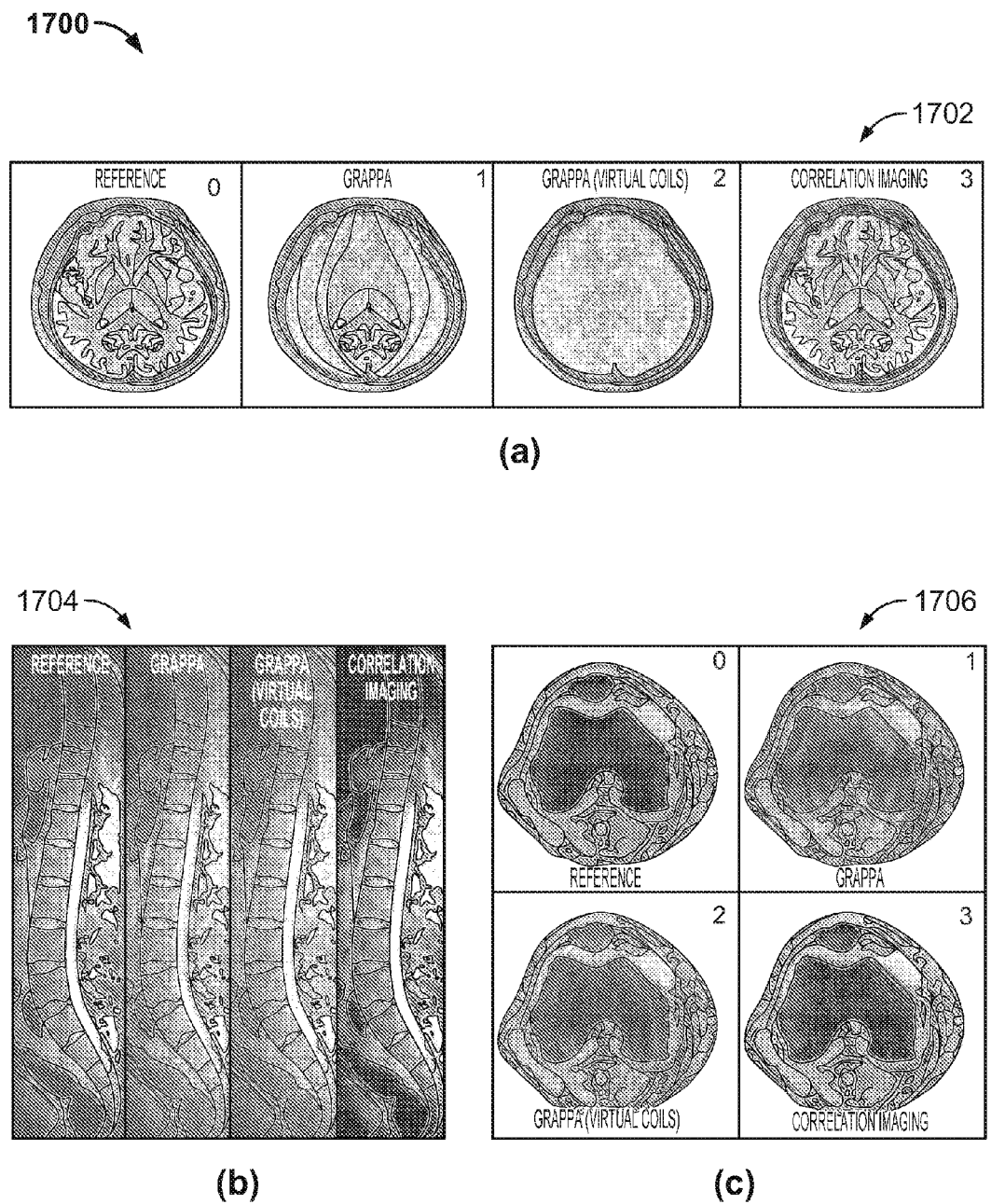
FIG. 17 shows (b) brain (b) spine (c) knee imaging comparisons between GRAPPA and correlation; and (d)-(f) Plots of reconstruction error against acceleration factor.
Figure 17:
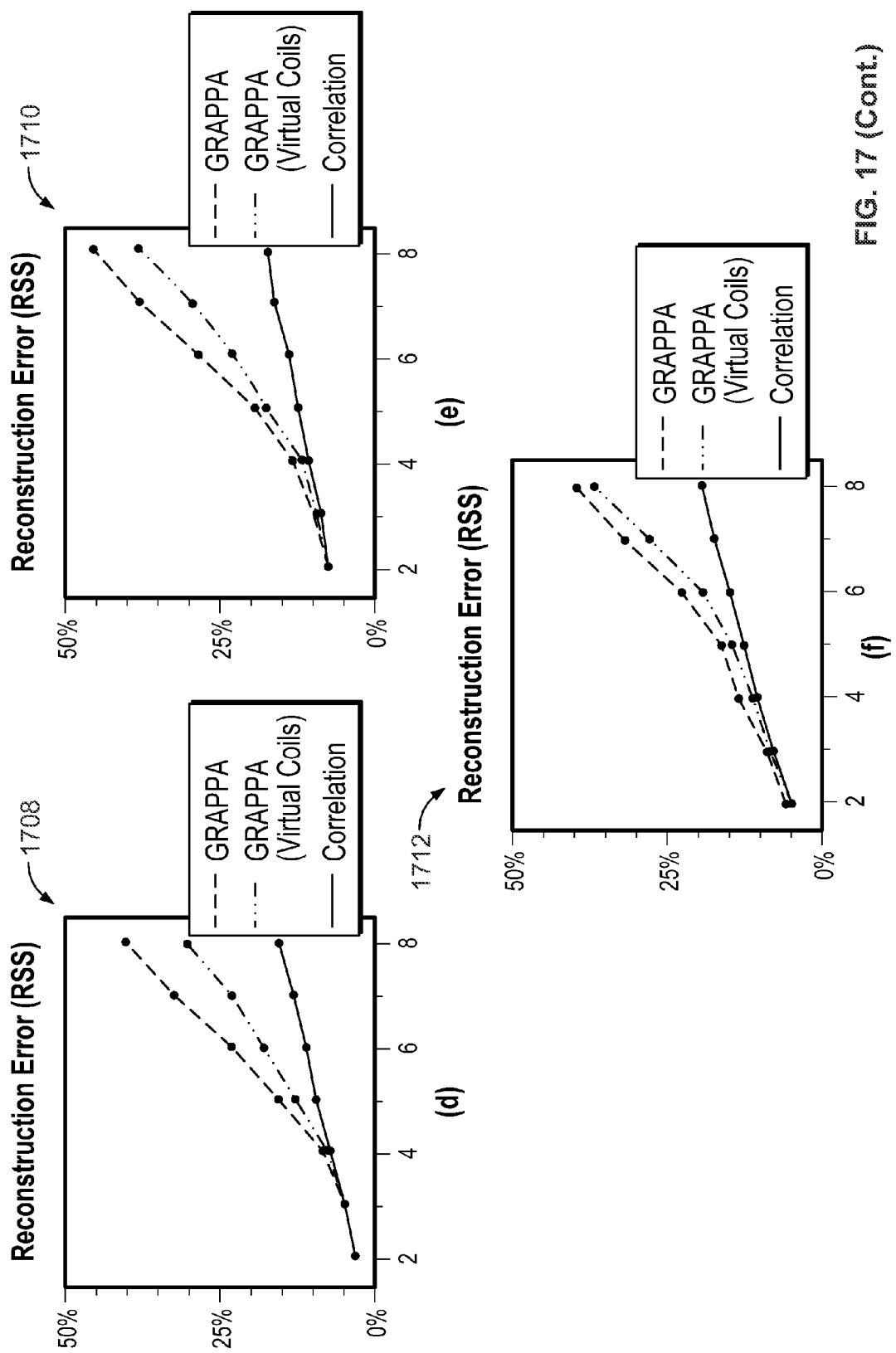

Due to this hardware limitation, the reconstruction errors of GRAPPA in all three experiments 1700 increase significantly faster when the undersampling factors change from 5 to 8 than those when the undersampling factors change from 2 to 4 as shown in FIG. 17. If an undersampling factor of 8 is used, GRAPPA image quality is clinically unacceptable as seen in brain scan 1702, spine scan 1704, and knee scan 1706. In comparison, the reconstruction errors of correlation imaging increase in a consistent fashion as the undersampling factors increase from 2 to 8. The image information is preserved well even when only ⅛ of fully sampled data is used in reconstruction in brain scan 1702, spine scan 1704, and knee scan 1706. This capability of overcoming the speed limit posed by RF coil arrays should be attributed to the inclusion of information (k-space conjugate symmetry) beyond coil sensitivity in the estimation of correlation functions. It should be mentioned that parallel imaging with virtual coils can also take advantage of k-space conjugate symmetry in addition to coil sensitivity. FIG. 17 shows that this technique can considerably improve GRAPPA reconstruction when using an undersampling factor>4. However, more improvement is observed in correlation imaging, e.g. correlation imaging gives clearly better image quality than GRAPPA with virtual coils when using an undersampling factor of 8 (FIGS. 17(*a*)-(*c*)).

FIG. 17 shows correlation imaging can overcome the speed limit posed by an RF coil array. All the data were acquired from two consecutive scans using a coil array with at most 4 elements in the phase encoding direction. Correlation functions were estimated from the first scan. Data in the second scan were undersampled for reconstruction. GRAPPA was calibrated with 24 ACS line from the second scan FIG. 17(*a*)-FIG. 17 (*c*). Comparison of correlation imaging and GRAPPA for an acceleration factor of 8 was used in brain 1702, spine 1704, and knee 1706 imaging. FIG. 17 (*d*)-FIG. 17(*f*) show plots of reconstruction errors against acceleration factors in brain 1708, spine 1710, and knee 1712 imaging. Correlation imaging performs better than GRAPPA when the acceleration factor is over 4, which is the maximal acceleration factor permitted on a clinical scanner using the coil arrays shown in FIG. 16. This improvement can be seen from both the image examples in FIG. 17(*a*)-FIG. 17 (*c*) and the reconstruction errors in FIG. 17(*d*)-FIG. 17(*f*).

The maximum acceleration factor allowed on a clinical scanner using these coil arrays is 4. Data acquisition: In the first experiment of FIG. 17(*a*), the same brain imaging data as in FIG. 14 were used. These data were acquired from two consecutive scans with different contrast.

In the second experiment of FIG. 17(*b*), two sets of spine imaging data were collected on a 3T MRI scanner. In the second scan, slices were shifted by 3 mm in the left-right direction relative to the first scan.

The data from the first scan were used to estimate correlation functions and those from the second scan were undersampled for reconstruction. GRAPPA reconstruction for the second scan was calibrated from 24 ACS lines. For acceleration factors<4, both GRAPPA and correlation imaging perform well. With acceleration factors>4, GRAPPA reconstruction quality degrades dramatically while correlation imaging does not. Even with an acceleration factor of 8, correlation imaging still gives high quality reconstruction (FIG. 17 (a.3) & FIG. 17 (b.3)).

Figure 18:
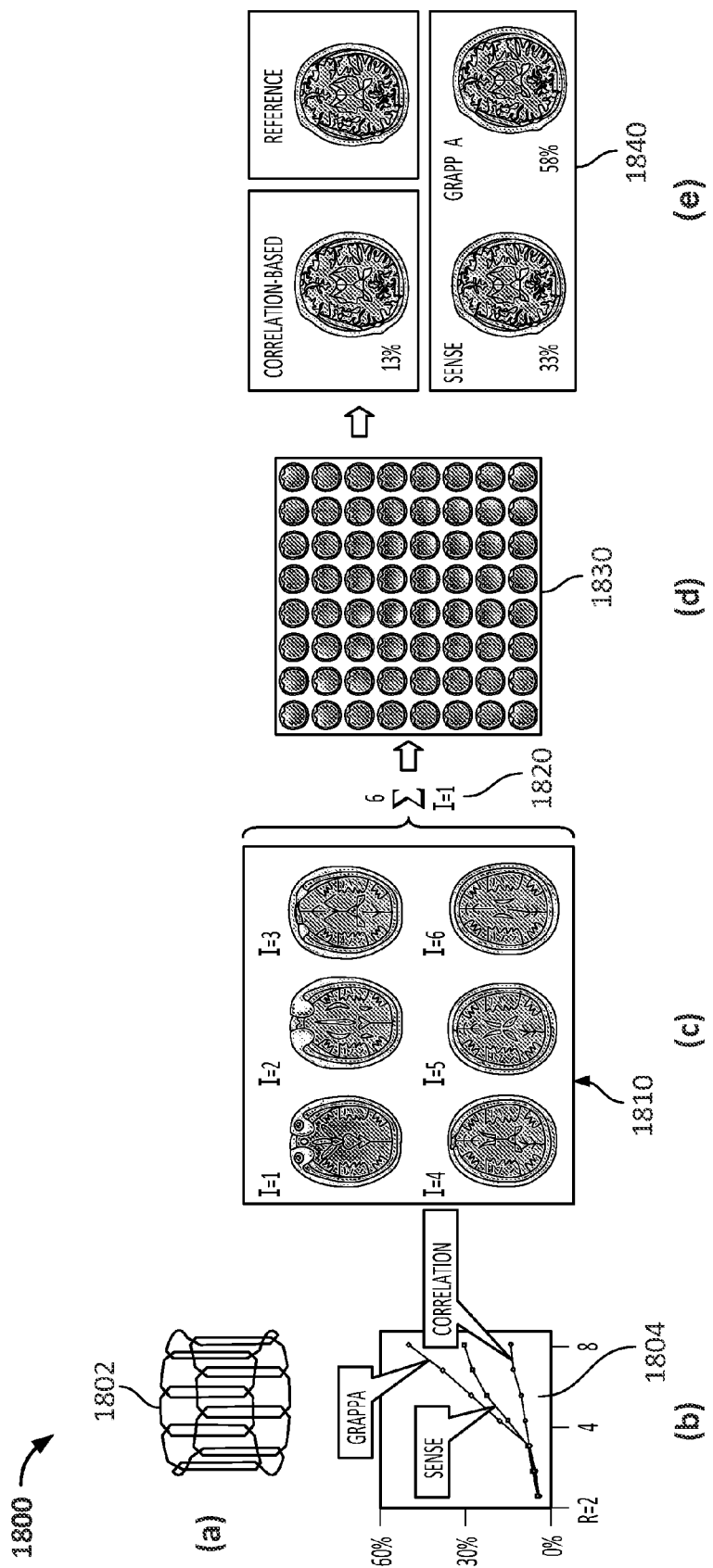
FIG. 18 diagrams an experimental results in brain imaging.

FIG. 18 shows experimental results 1800 in brain imaging. FIG. 18(*a*) shows a coil layout 1802 for multi-channel data acquisition. As shown in FIG. 18(*a*), the head coil array 1802 used in this work has at most 4 elements in any direction and this number is the maximal parallel imaging acceleration factor allowed on a clinical scanner using this coil array. Consequently, it can be seen that GRAPPA and SENSE perform well when R≤4 while the errors increase fast when R>4 (FIG. 18(*b*)). FIG. 18 (*b*) shows Root-Mean-Squared errors (RMSE) 1804 in SENSE, GRAPPA and correlation-based reconstruction for R=2, 3 . . . , 8. In comparison, correlation-based reconstruction gives acceptable reconstruction errors for reduction factors from 2 to 8. In the reconstruction example (R=8) given by FIG. 18(*c*)-FIG. 18(*e*), correlation functions were estimated from 6 calibration images with different contrast and around the location of the image to be reconstructed (reference image). FIG. 18(*c*) depicts low-resolution calibration images 1810 for estimating correlation functions (FIG. 7(*b*)). FIG. 18(*d*) shows estimated auto-and cross-channel correlation functions in image space (8×8 image matrix) 1830. FIG. 18(*e*) is a comparison 1840 of correlation-based reconstruction, SENSE and GRAPPA with R=8 in reference to the image from fully-sampled data. Correlation functions 1830 in FIG. 18(*d*) bring the information from all 6 calibration images 1820 into correlation-based reconstruction.

The ensemble summation 1820 of the correlation functions estimated from all 6 calibration images reduces the incoherent information in calibration data, providing data correlation needed for reconstruction. By bringing both coil sensitivity information and image content similarity into image reconstruction, correlation-based reconstruction preserves image information well with only 32 phase encoding lines (R=8). The low image quality provided by SENSE and GRAPPA using the same amount of data demonstrates this acceleration is beyond the parallel imaging acceleration limit permitted by the 8-channel coil array. It was also found that the robustness of correlation-based reconstruction increases as the number of calibration images (requires >3 in this experiment) in ensemble summation. The use of a small number of calibration images may introduce unwanted information about image contrast and anatomical structure in the estimated correlation functions, manifesting as destructive image artifacts in reconstruction. In this work, the use of multiple calibration images for ensemble summation in the estimation of correlation functions removes the necessity for iterative algorithm proposed in our previous work, providing simplicity for clinical translation.

The current disclosure shows that high-speed image reconstruction can be successfully implemented using correlation functions estimated from multiple calibration images with the same or different contrast and at the same (or approximately the same) scan location. This implies that the similarity in both coil sensitivity and image content provides useful information for correlation-based reconstruction. By introducing an ensemble summation method in the estimation of correlation functions, correlation-based reconstruction provides a generic approach to overcoming parallel imaging acceleration limit posed by a coil array in static MRI.

Figure 19:
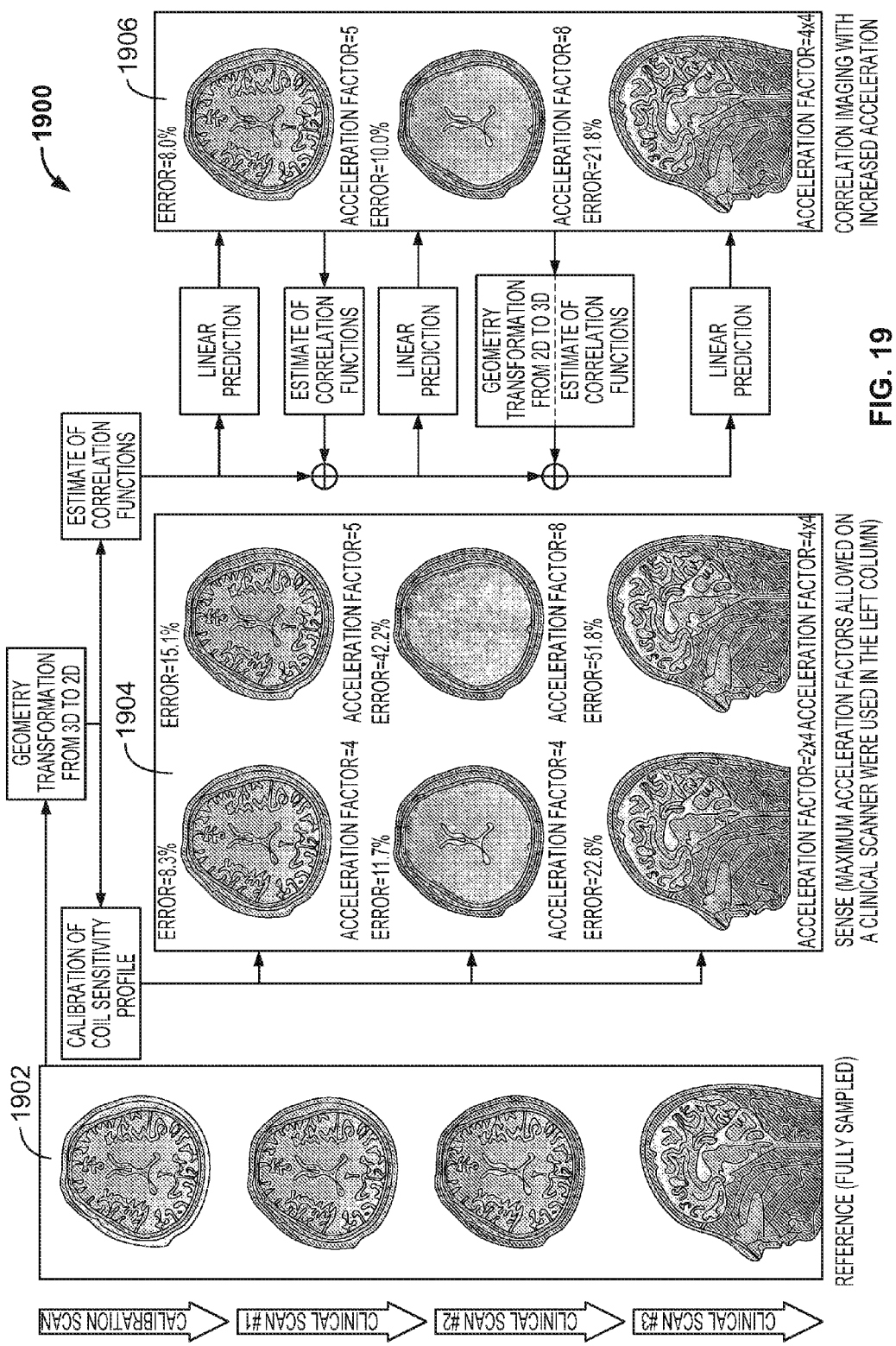
FIG. 19 demonstrates correlation imaging optimizing overall imaging speed of multiple scans in a clinical MRI protocol.

FIG. 19 demonstrates 1900 that correlation imaging can optimize the overall imaging speed of multiple scans 1902 in a clinical MRI protocol by dynamically increasing the acceleration factor 1904 with data acquisition. Anatomical brain images were collected on a 3.0 T clinical MRI system with an 8-channel head receive coil array. A low-resolution calibration scan was first performed using a T1-weighted 3D gradient echo sequence. Then three clinical scans 1902 were performed consecutively. All the data were fully sampled.

The data from three clinical scans were undersampled for reconstruction. SENSE reconstruction using clinically implemented algorithm was used as references. The coil sensitivity calibration for SENSE was performed using the low-resolution calibration data. In correlation imaging, the linear prediction uses correlation functions estimated from both the low-resolution calibration scan data and those from high-resolution (256×256) data already reconstructed from available data.

Because the estimate of correlation functions is improved with the use of more previous imaging data, correlation imaging allows for the increase of acceleration factors with data acquisition (5 in the first scan, 8 in the second and 16 in the last) providing image quality comparable to SENSE with lower acceleration factors of 4 in the first and second scan, and 8 in the third scan. It should be noted 4 for 2D scan and 8 for 3D scan are the maximal acceleration factors permitted on a clinical scanner using an 8-channel head coil array. Therefore, correlation imaging is capable of overcoming this physical limitation posed by hardware in clinical MRI. Errors 1906 are shown in the last column.

Optimization of Multi-Scan Imaging in a Clinical Protocol

Figure 20:
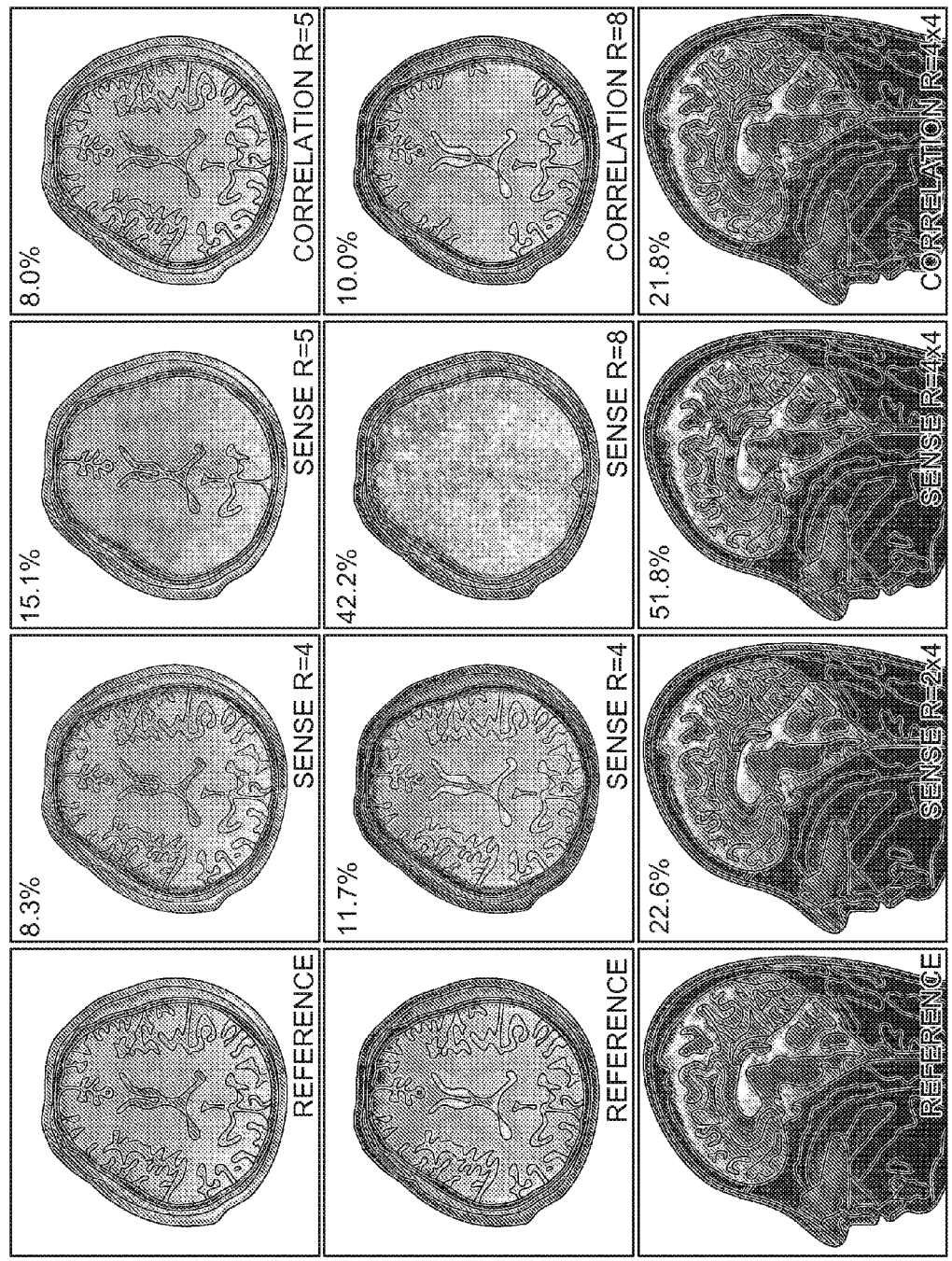
FIG. 20 shows how correlation imaging increasing the acceleration factor with data acquisition.

The data acquired from the anatomical neuroimaging experiment (a calibration scan followed by three anatomical scans) are used to demonstrate the ability of correlation imaging to optimize multi-scan data acquisition for economizing the total scan time of a clinical MRI protocol. Since this experiment follows the same data acquisition sequence as that in SENSE on a clinical scanner, we used a regularized SENSE method implemented on the Philips MRI system as a reference in the demonstration. As shown in FIG. 20 with reference 2002, because the estimation of correlation functions can be improved with the use of more high-resolution data, correlation imaging 2008 allows for the increase of acceleration factors as imaging proceeds (5 for the first, 8 for the second and 16 for the third scan in this experiment) from row 2010 to 2012 to 2014, providing an approach to dynamically optimizing the multi-scan imaging with data acquisition. These reconstruction results are comparable to those using SENSE with lower acceleration factors (4 for the first and second 2D scans, 8 for the third 3D scan). FIG. 20 also shows that SENSE with the same acceleration factors 2004 and 2006 as correlation imaging 2008 produce clinically unacceptable aliasing artifacts and reconstruction errors. As discussed previously, these artifacts and errors arise not from SENSE, but from the limitation of RF coil array (8-channel head coil array in FIG. 16) that allows for only 4-fold parallel imaging acceleration for a 2D scan and 8-fold for a 3D scan. This result also demonstrates that correlation imaging can overcome the parallel imaging acceleration limit posed by an RF coil array.

FIG. 20 shows that correlation imaging can economize the total imaging time of multiple scans in a clinical MRI protocol 2000 by increasing the acceleration factor with data acquisition. From the top to the bottom row are T1 weighted 2D, T2 weighted 2D, and T2 weighted 3D images acquired in three consecutive scans for anatomical neuroimaging. In the image reconstruction for the first scan, correlation functions were estimated from the data acquired in a low-resolution (64×64) calibration scan before these scans (reference 2002). In the image reconstruction for the other two scans, correlation functions were estimated from both the low-resolution data from the calibration scan and those high-resolution (256×256) data already reconstructed. As the use of more data can improve the estimate of correlation functions, correlation imaging allows for the use of acceleration factors of 5 in the first scan, 8 in the second scan and 16 in the last scan, providing image quality comparable to SENSE with lower acceleration factors of 4 in the first and second scan, and 8 in the third scan. It should be noted 4 for 2D scan and 8 for 3D scan are the maximal acceleration factors permitted on a clinical scanner using an 8-channel head coil array. The numbers on the upper-left corner of the reconstructed images are RSS errors.

Figure 21:
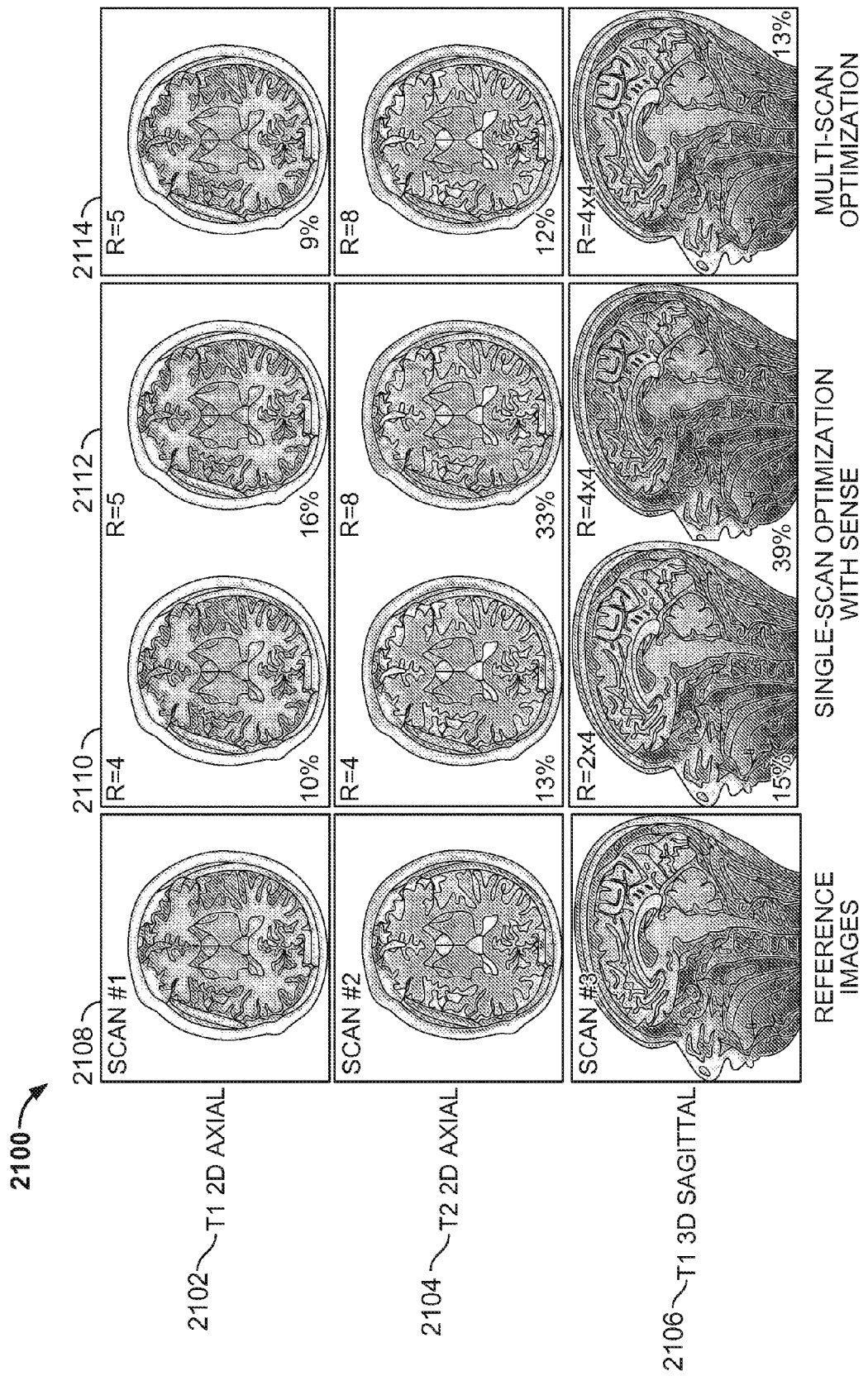
FIG. 21 shows a comparison of single- and multi-scan optimization in a three-scan anatomical MRI protocol.

FIG. 21 compares the results using two different optimization strategies. It can be seen that multi-scan optimization strategy allows for the increase of acceleration factors as imaging proceeds (5 for the first, 8 for the second, 16 for the third scans) 2110 to 2112 to 2114. The reconstruction is comparable to that using SENSE optimized for single-scan MRI with lower but maximum acceleration factors allowed on clinical scanners (4 for the 2D scans and 8 for the 3D scan). It is also shown that conventional SENSE with the same acceleration factors as multi-scan optimization gives higher noise and artifacts. FIG. 21 shows a comparison of single- and multi-scan optimization in a three-scan anatomical MRI protocol. "R" represents reduction or acceleration factor. The percentage numbers are root mean square errors in reconstruction.

Benefits and Challenges of Correlation Imaging in Reference to SENSE and GRAPPA

In the framework of correlation imaging, the linear predictor is analogous to the k-space weighting coefficients in GRAPPA and the unfolding matrix in SENSE. It is a concept borrowed from the field of signal processing and similar to the filter bank theory introduced recently. The use of this terminology is intended to indicate that the mathematical model underlying correlation imaging is linear, which provides simplicity for clinical implementation. It should be noted that correlation imaging follows the same schemes to resolve the linear equations and perform the k- or image-space reconstruction as SENSE or GRAPPA. The primary difference of correlation imaging from these two techniques is the formation of the linear equations: SENSE and GRAPPA use a single set of low-resolution calibration data to calculate the linear equation coefficients (GRAPPA uses images from ACS data with the same contrast and SENSE uses coil sensitivity profiles without any image information). In correlation imaging, the linear equation coefficients are correlation functions statistically estimated from multiple images that share the same information, but have different contrast and resolution. This offers two apparent benefits: First, the use of all available multi-scan imaging data allows for the optimization of multiple scans in aggregate for economizing the total scan time of a clinical protocol, as demonstrated in the experiment shown in FIG. 20. Second, the correlation function is a generic concept that can quantify multiple data correlation mechanisms underlying multi-scan and multi-channel data acquisition. This concept is used to quantify data correlation introduced by coil sensitivity and k-space conjugate symmetry. In the experiments shown in FIG. 17 and FIG. 20, it is found that correlation imaging based on multiple data correlation mechanisms allows accelerating MRI by a factor higher than the number of coil elements in the phase encoding direction, providing an approach to overcoming the parallel imaging acceleration limit posed by an RF coil array.

Challenges to correlation imaging, include, the estimation of correlation functions from those images with dramatic difference in contrast, resolution and geometry may bring the image difference into the calculation of linear predictor producing artifacts in the final reconstruction (FIG. 12 and FIG. 13). Furthermore, if previously reconstructed images are used for the ensemble summation in Eq. 10, the previous reconstruction error may lead to cascade effect in the following reconstruction. Other error sources in the estimation of correlation functions include artifacts generated by eddy currents and B0/B1 field inhomogeneity. A way to overcoming these challenges is to select a great number of previous images with sufficient shared information for reconstruction. As the image difference, reconstruction error, or artifacts are randomly varying across scans, ensemble summation will suppress these random factors because of incoherence and the estimated correlation functions will converge to the deterministic data correlation that arise from the coil sensitivity and anatomical structure information shared by multi-scan and multi-channel imaging data. Because a clinical protocol always provides a large amount of imaging data, correlation imaging is well suited for clinical MRI.

Use of Previous Images Around the Image to be Reconstructed for the Estimate of Correlation Functions In the estimation of correlation functions, images for ensemble summation are selected not only from the same location of the image to be reconstructed but also from the nearby locations. It is not obvious that correlation functions can be estimated from images at different locations, since neither coil sensitivity nor anatomical structure is exactly the same. In the experiment 1210 shown in FIG. 12, the possibility of MRI signal overlap across neighboring slices in data acquisition can also be excluded because the slice gap is two times larger (8 mm) than the slice thickness (4 mm) The experimental findings in this work suggest: It is the coil sensitivity difference between aliased pixels in the phase encoding direction that provides the capability of un-aliasing in the reconstruction from undersampled data. In neighboring slices, the slice gap is much smaller than the distance between aliased pixels. The coil sensitivity difference between aliased pixels in the phase encoding direction dominates that across slices, implying neighboring slices share the same information about coil sensitivity difference for un-aliasing. Furthermore, although neighboring slices are not exactly the same in image content, they have a certain degree of similarity because of anatomical structure continuity in slice direction. Therefore, it is sensible to use images around the image to be reconstructed for the statistical estimation of correlation functions.

Figure 22:
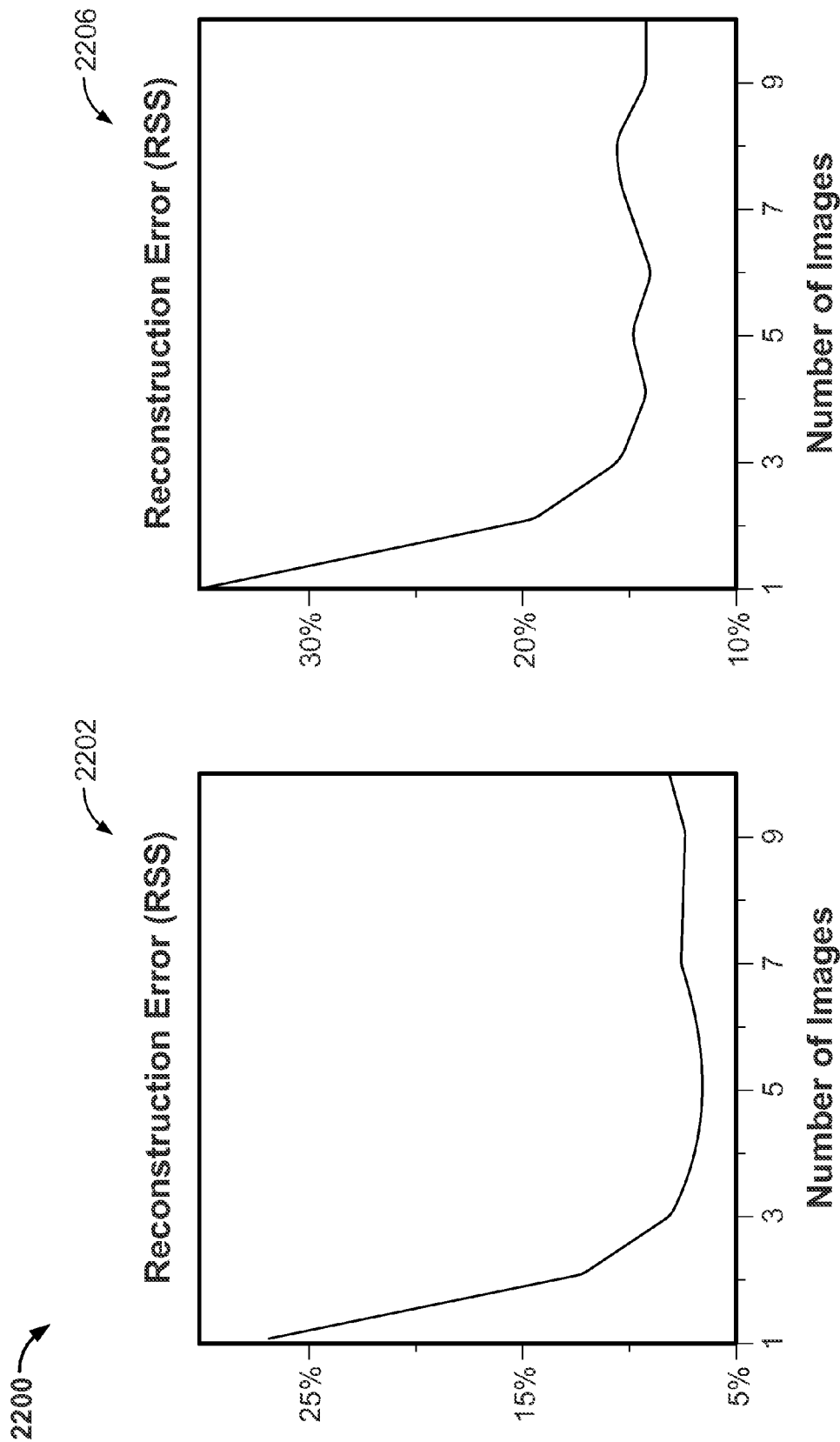
FIG. 22 depicts plots of the reconstruction errors against the number of images.

The use of images around the location of the image to be reconstructed may raise a concern about how to determine the distance range within which those images should be selected. Clearly, the images will have more uncorrelated information and less shared information with the increase of their distances to the image to be reconstructed. A question to answer is whether the unexpected inclusion of an image with dominant uncorrelated information (located in a large distance) would be destructive to the estimation of correlation functions. In our experiments, we found that the ensemble summation in Eq. 10 can suppress the uncorrelated information if the number of images with shared information is sufficient. As shown in FIG. 22, we measured how the reconstruction error varies with the increase of images for the estimation of correlation functions in the experiments shown in FIG. 12 and FIG. 13. In this measurement, we first include several neighboring slices around the image to be reconstructed and then those further away. It can be seen that the reconstruction errors decrease significantly with the inclusion of neighboring images and their change is inconsiderable when including those images further away from neighboring slices afterwards. Consequently, one can use more than needed images in Eq. 10 and the determination of this number of previous images relies on the computation affordability in most cases implying the practical utility of correlation imaging is high.

FIG. 22 shows plots 2200 of the reconstruction errors against the number of images used in Eq. 7 in brain (left) and spine (right) imaging experiments shown in FIG. 12 (2202) and FIG. 13 (2206). Neighboring slices are first used in Eq. 10 and then more images further away are included. If the information in neighboring slices is sufficient, the inclusion of those images with dominant uncorrelated information (far away from the image to be reconstructed) causes no considerable effect on reconstruction error.

Advantage of Correlation Imaging when Using k-Space Conjugate Symmetric Relationship In the current disclosure, correlation imaging is implemented using the data correlation arising from both coil sensitivity and k-space conjugate symmetric relationship. It is experimentally demonstrated (FIG. 17) that this framework gives better performance than GRAPPA with virtual coils, which also uses both types of data correlation. This gain in correlation imaging arises from the use of multiple images for ensemble summation in the estimation of correlation functions. A concern from the use of k-space conjugate symmetric relationship is the existence of image-space phase difference (although minor) between the original and conjugate symmetric data. In parallel imaging, a deterministic approach is used to calibrate the reconstruction with both original and conjugate symmetric data using a single set of low-resolution imaging data. As the calibration cannot provide sufficient phase information, the deterministic calculation will be biased by the approximation made in the underlying mathematical model. In correlation imaging, the phase information cannot be calibrated either because this information varies across images. However, the interference from image-space phase difference between original and conjugate symmetric data can be reduced as effectively as the image contrast interference (FIG. 12) by the ensemble summation over a large amount of imaging data in the estimation of correlation functions. This is an advantage of statistic estimate over deterministic calculation.

REFERENCES

The Following References are Incorporated Herein by Reference

1. Petersein J, Saini S. Fast MR imaging: technical strategies. Am J Roentgenol 1995; 165(5):1105-1109.
2. Tsao J. Ultrafast imaging: principles, pitfalls, solutions, and applications. J Magn Reson Imaging 2010; 32(2):252-266.
3. Cheng A, Selvanayagam J. High field cardiac magnetic resonance imaging—current and future perspectives. Heart Lung Circ 2010; 19(3):145-153.

4. Hussain S, Wielopolski P, Martin D. Abdominal magnetic resonance imaging at 3.0 T: problem or a promise for the future. Top Magn Reson Imaging 2005; 15(4):325-335.
5. Glover G. Overview of functional magnetic resonance imaging. Neurosurg Clin N Am 2011; 22(2):133-139.
6. Sodickson D K, Manning W J. Simultaneous acquisition of spatial harmonic (SMASH): ultra-fast imaging with radiofrequency coil arrays. Magn Reson Med 1997; 38(4): 591-603.
7. Pruessmann K P, Weiger M, Scheidegger M B, Boesiger P. SENSE: Sensitivity encoding for fast MRI. Magn Reson Med 1999; 42(5):952-962.
8. Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47(6):1202-1210.
9. Buckwalter K. Optimizing imaging techniques in the postoperative patient. Semin Musculoskelet Radiol 2007; 11(3):261-272.
10. Tsao J, Boesiger P, Pruessmann K P. k-t BLAST and k-t SENSE: Dynamic MRI with high frame rate exploiting spatiotemporal correlations. Magn Reson Med 2003; 50:1031-1042.
11. Huang F, Akao J, Vijayakumar S, Duensing G R, Limkeman M. k-t GRAPPA: A k-space implementation for dynamic MRI with high reduction factor. Magn Reson Med 2005; 54:1172-1184.
12. Lustig M, Donoho D, Pauly J M. Sparse MRI: The application of compressed sensing for rapid MR imaging. Magn Reson Med 2007; 58:1182-1195.
13. Lustig M, Pauly J. SPIRit: Iterative self-consistent parallel imaging reconstruction from arbitrary k-space. Magn Reson Med 2010; 64:457-471.
14. Margosian P, Schmitt F, Purdy D. Faster MR imaging: imaging with half the data. Health Care Instrumentation 1986; 1:195-197.
15. Zhang X, Yacoub E, Hu X. New Strategy for Reconstructing Partial-Fourier Imaging Data in Functional MRI. Magn Reson Med 2001; 46:1045-1048.
16. Noll D C, Nishimura D G, Macovski A. Homodyne detection in magnetic resonance imaging. IEEE Trans Med Imag 1991; 10(2):154-163.
17. McGibney G, Smith M, Nichols S, Grawley A. Quantitative evaluation of several partial Fourier reconstruction algorithms used in MRI. Magn Reson Med 1993; 30:51-59.
18. Modo M, Bulte J W M. Magnetic Resonance Neuroimaging: Methods and Protocols. Totowa, N.J.: Humana Press Inc.; 2011.
19. van Vaals J J, Brummer M E, Dixon W T, Tuithof H H, Engels H, Nelson R C, Gerety B M, J. L. C, J. A. dB. "Keyhole" method for accelerating imaging of contrast agent uptake. J Magn Reson Imaging 1993; 3(4):671-675.
20. Jones R A, Haraldseth O, Muller T B, TRinck P A, Oksendal A N. K-space substitution: a novel dynamic imaging technique. Magn Reson Med 1993; 29(6):830-834.
21. Hu X. On the "keyhole" technique. J Magn Reson Imaging 1994; 4:231.
22. Liang Z-P, Boada F, Haacke E M, Lauterbur P C, Smith M R. Constrained reconstruction methods in MR imaging. Rev Magn Reson Med 1992; 4:67-185.
23. Haacke E M, Liang Z-P, Izen S H. Superresolution reconstruction through object modeling and estimation. IEEE Trans Acoust, Speech, Signal Processing 1989; 37:592-595.
24. Liang Z-P, Jiang H, Hess C P, Lauterbur P C. Dynamic imaging by model estimation. Int J Imag Sys Tech 1997; 8:551-557.
25. Jacob M, Zhu X, Ebel A, Schuff N, Liang Z-P. Improved model-based magnetic resonance spectrosopic imaging. IEEE Trans Med Imag 2007; 52:3201-3226.
26. Madore B, Glover G H, Pelc N J. Unaliasing by Fourier-encoding the overlaps using temporal dimension (UNFOLD) applied to cardiac imaging and fMRI. Magn Reson Med 1999; 42:813-828.
27. Hu X, Parrish T. Reduction of field of view for dynamic imaging. Magn Reson Med 1994; 31:691-694.
28. Brummer M E, David M P, Hong C Y, Pettigrew R I, Millet-Roig J, Dixon W T. Noquist: Reduced field-of-view imaging by direct Fourier inversion. Magn Reson Med 2004; 51:331-342.
29. Jung H, Ye J C, Kim E Y. Improved k-t BLAST and k-t SENSE using FOCUSS. Phys Med Biol 2007; 52:3201-3206.
30. Honal M, Bauer S, Ludwig U, Leupold J. Increasing efficiency of parallel imaging for 2D multislice acquisitions. Magn Reson Med 2009; 61(6):1459-1470.
31. Arunachalam A, Samsonov A, Block W E. Self-calibrated GRAPPA method for 2D and 3D radial data. Magn Reson Med 2007; 57:931-938.
32. Hayes M H. Statistical Digital Signal Processing and Modeling. New York, Chichester, Brisbane, Toronto, Singapore: John Wiley & Sons, Inc.; 1996.
33. Blaimer M, Gutberlet M, Kellman P, Breuer F A, Kostler H, Griswold M A. Virtual coil concept for improved parallel MRI employing conjugate symmetric signals. Magn Reson Med 2009; 61:93-102.
34. Friston K, Ashburner J, Frith C, Poline J. Spatial registration and normalization of images. Hum Brain Mapp 1995; 2:165-189.
35. Shim H, Chang S, Tao C, Wang J-H, Kwoh C, Bae K. Knee cartilage: Efficient and reproducible segmentation on high-spatial-resolution MR images with the semiautomated graph-cut method. Raidol 2009; 251(2):548-556.
36. Wang J, Kluge T, Nittka M, Jellus V, Kuehn B, Kiefer B. Paralllel acquisition techniques with modified SENSE reconstruction mSENSE. Proc Int Soc Magn Reson Med 2001:92.
37. Fuderer M, Brink Jvd, Jurrissen M. SENSE reconstruction using feed forward regularization. Proc Int Soc Magn Reson Med 2004; 11:2130.
38. Ying L, Liang Z-P. Parallel MRI using phased array coils: multichannel sampling theory meets spin physics. IEEE Signal Processing Magazine 2010; 27:90-98.
39. Ying L, Abdelsalam E. Parallel MRI reconstruction: A filter-bank approach. Proc IEEE Engin Med & Bio Conf 2005:1374-1377.
40. Chen Z, Zhang J, Li S, Chai L. FB analysis of PMRI and its applications to H infinity optimal SENSE reconstruction. Proc IEEE Int Conf Image Proc 2007:129-132.
41. Sharif B, Y. B. Auto-calibrated parallel imaging using a dsitortion-optimal filter bank. Proc Int Soc Magn Reson Med 2010 2010:4910.
42. Sharif B, Bresler Y. Distortion-optimal self-calibrating parallel MRI by blind interpolation in subsampled filter banks. Proc IEEE Int Symp Biomed Imaging 2011.
43. Feinberg D A, Oshio K. Phase errors in multi-shot echo planar imaging. Magn Reson Med 1994; 32:535-539.

The invention claimed is:

1. A method of economizing a Magnetic Resonance Imaging (MRI) protocol using an MRI apparatus, the method comprising the steps of:
   collecting a plurality of prior MRI image scan data sets for a subject;
   obtaining a current MRI image scan data set for the subject; and reconstructing the current MRI image scan data set using an aggregate of the plurality of prior MRI image data sets, wherein the reconstructing step includes a step of estimating correlation functions by ensemble summation of the plurality of prior MRI image scan data sets.

2. The method of claim 1, further comprising the step of aggregating the current MRI image scan data set with the plurality of prior MRI image scan data sets to reconstruct a subsequent MRI image data set.

3. The method of claim 1, wherein the step of reconstructing the current MRI image scan data set is accomplished by sharing prior and current MRI scan data information, and the shared scan data information comprises at least one of:
a coil sensitivity information;
an image scan data content similarity;
calibration MRI image data;
undersampled MRI image data;
three-dimensional information;
four-dimensional information;
spatial information; and
temporal information.

4. The method of claim 1, wherein the prior MRI image scan data sets include multi-scan and multi-channel information.

5. The method of claim 1, wherein the current and prior MRI data set scans are taken using the same MRI scan protocols.

6. The method of claim 1, wherein the prior MRI image scan data sets and the current MRI image scan data set are obtained within a single MRI protocol.

7. The method of claim 1, wherein the prior MRI image scan data sets and the current MRI image scan data set are performed on approximately a same location on the subject.

8. The method of claim 7, wherein a same location is defined as where scan slices are thicker than a slice gap separating each scan.

9. The method of claim 1, wherein the prior MRI image scan data sets and the current MRI image scan data set are not all obtained within the same location with the subject.

10. The method of claim 1, wherein the reconstructing step includes a step of dynamic scan imaging.

11. The method of claim 1, wherein the reconstructing step includes a step of estimating the correlation functions of the plurality of prior MRI image scan data sets and current MRI image scan data sets using the following formula:

$$c_{d_i d_j}(k) = \sum_{l \in previous\ images} \left\{ \frac{1}{M^l - |k|} \sum_{-M^l/2 \leq k', k'+k \leq M^l/2 - 1} [d_i^l(k+k')][d_j^l(k')]^{conj} \right\}.$$

12. The method of claim 1, wherein the step of reconstructing the current MRI image scan data set incorporates an image-space predictor resolved from:

$$\sum_{i=1}^{N} \left[ \sum_{all\ r'} C_{ij}(r-r') C_t(r') \right] U_i(r) = C_{mj}(r) \sum_{all\ k'} t_s(k'),$$

$j = 1, 2, \ldots, N.$

13. The method of claim 12, wherein N-channel summation of channel-by-channel linear convolution between the acquired current data and a linear predictor gives the reconstructed data.

14. The method of claim 1, wherein at least one prior MRI image scan data set is taken from a calibration scan.

15. The method of claim 1, wherein the current MRI image scan iteration is an undersampled MRI image scan.

16. The method of claim 1, wherein the plurality of prior MRI image scan data sets includes at least five initial scans.

17. The method of claim 1, wherein:
the scan data in the prior MRI image scan data sets is ordered consecutively by at least one of order of scan and by data value.

18. The method of claim 1, wherein:
at least one of the prior MRI image scan data sets and the current MRI image scan data set has at least one of a different contrast, resolution, offset, and offset angle.

19. The method of claim 1, wherein the method of economizing MRI protocol further comprises the step of aggregating the current MRI image scan data set with the plurality of prior MRI image scan data sets for use in reconstructing at least one of the prior MRI image scan data sets.

20. The method of claim 1, wherein the each of the prior MRI image scan data sets and the current MRI image scan data set have at least one of:
different scan planes with respect to the other of the prior MRI image scan data sets and the current MRI image scan data set;
different scan contrast with respect to the other of the prior MRI image scan data sets and the current MRI image scan data set;
different scan type with respect to the other of the prior MRI image scan data sets and the current MRI image scan data set; and
different scan protocol with respect to the other of the prior MRI image scan data sets and the current MRI image scan data set.

21. The method of claim 1, wherein the plurality of prior MRI image scan data sets include at least three prior MRI image scan data sets.

22. The method of claim 1, wherein the step of reconstructing the current MRI image is performed after a selected number, N, of MRI scan data sets have been acquired, and the plurality of prior MRI image scan data sets includes at least one of the N acquired MRI scan data sets.

23. A method of economizing a Magnetic Resonance Imaging (MRI) protocol using an MRI apparatus, the method comprising the steps of:
collecting a plurality of prior MRI image scan data sets for a subject, wherein the prior MRI image scan data sets include multi-scan and multi-channel information;
obtaining a current MRI image scan data set for the subject; and
reconstructing the current MRI image scan data set using an aggregate of the plurality of prior MRI image scan data sets, wherein reconstructing the current MRI scan data set further comprises the step of solving a set of linear equations by using a shared unfolding matrix calculated from the prior MRI image scan data sets as unknowns and the multi-scan MRI image data sets as the coefficients, and wherein reconstructing the current MRI scan data set further comprises estimating a correlation function by ensemble summation of the plurality of prior MRI image scan data sets.

24. A method of economizing a Magnetic Resonance Imaging (MRI) protocol using an MRI apparatus, the method comprising the steps of:
  collecting a plurality of prior MRI image scan data sets for a subject;
  obtaining a current MRI image scan data set for the subject;
  reconstructing the current MRI image scan data set using an aggregate of the plurality of prior MRI image scan data sets;
  wherein the step of reconstructing the current MRI image scan data set includes modeling a linear predictor to reconstruct an undersampled image data set to fully-sampled data; and
  wherein the step of reconstructing the current MRI image scan data set includes estimating a correlation function by ensemble summation of the plurality of prior MRI image scan data sets.

25. The method of claim 24, wherein the undersampled image data set is one of:
  (a) the plurality of prior MRI image data sets; and
  (b) a combination of the plurality of prior MRI image data sets and the current MRI image scan data set.

26. The method of claim 24, wherein the linear predictor, in k-space, is resolved from:

$$\sum_{i=1}^{N} \sum_{all\ k'} c_{ij}(k-k')c_t(k-k')u_i(k') = c_{mj}(k)\sum_{all\ k'} t_s(k').$$

27. The method of claim 24, wherein the linear predictor, in image-space, is resolved from:

$$\sum_{i=1}^{N} \left[\sum_{all\ r'} C_{ij}(r-r')C_t(r')\right]U_i(r) = C_{mj}(r)\sum_{all\ k'} t_s(k'),$$
$$j = 1, 2, \ldots, N.$$

28. The method of claim 24, wherein the linear predictor includes coefficients that are correlation functions estimated from a plurality of prior MRI image data sets.

29. The method of claim 28, wherein the correlation functions are updated upon the completion of the current scan.

30. The method of claim 28, wherein the correlation function between two channels i and j, in k-space, is estimated from imaging data of prior scans by:

$$c_{ij}(k) = \mathrm{mean}\{d_i(k')d^*_j(k'+k)\}_{over\ k'}.$$

31. The method of claim 28, wherein the correlation function from channels i and j, in k-space, is estimated by:

$$c_{d_id_j}(k) = \sum_{l \in previous\ images} \left\{ \frac{1}{M^l - |k|} \sum_{-M^l/2 \le k',\ k'+k \le M^l/2-1} [d^l_i(k+k')][d^l_j(k')]^{conj} \right\}.$$

32. A method of economizing a Magnetic Resonance Imaging (MRI) protocol using an MRI apparatus, the method comprising the steps of:
  collecting a plurality of prior MRI image scan data sets for a subject;
  obtaining a current MRI image scan data set for the subject;
  reconstructing the current MRI image scan data set using an aggregate of the plurality of prior MRI image scan data sets; and
  increasing an acceleration factor of a current scan as compared to a prior scan by increasing the number of intervening scans;
  wherein the acceleration factor is the multiple increase in speed of acquiring a current scan as compared to said prior scan, while acquiring an MRI image scan with similar noise data; and
  wherein the step of reconstructing the current MRI image scan data set includes estimating a correlation function by ensemble summation of the plurality of prior MRI image scan data sets.

33. The method of claim 32, wherein:
  the acceleration factor is independent from a number of coil elements in a phase encoding direction of the MRI apparatus.

34. A method of economizing a Magnetic Resonance Imaging (MRI) protocol using an MRI apparatus, the method comprising the steps of:
  collecting a plurality of prior MRI image scan data sets for a subject;
  obtaining a current MRI image scan data set for the subject;
  reconstructing the current MRI image scan data set using an aggregate of the plurality of prior MRI image scan data sets;
  assigning a weight to each scan in the plurality of prior MRI image data sets; and
  reconstructing the current MRI image scan data set by selecting the scans with the greatest weight;
  wherein the weight is based on at least one of an impact in time of the scan and data rich information of the scan; and
  wherein the step of reconstructing the current MRI image scan data set includes estimating a correlation function by ensemble summation of the plurality of prior MRI image scan data sets.

35. A method of economizing Magnetic Resonance Imaging (MRI) protocol using an MRI apparatus, comprising the steps of:
  collecting a plurality of prior MRI image scan data sets for a subject, wherein at least one prior MRI image scan data set is taken from a calibration scan;
  obtaining a current MRI image scan data set for the subject;
  reconstructing the current MRI image scan data set using an aggregate of the plurality of prior MRI image scan data sets, wherein the reconstructing step includes a step of estimating correlation functions by ensemble summation of the plurality of prior MRI image scan data sets; and
  performing ensemble summation using at least one of calibration image data and reconstructed image scan data of the subject.

36. The method of claim 35, wherein the method of economizing an MRI protocol further comprises step of:
  generating calibration MRI image data that includes multiple calibration images around the location of the image to be reconstructed;
  wherein at least one of the multiple calibration images has a different contrast from a second calibration image.

37. The method of claim 36, further comprising, generating coil sensitivity profiles with calibration MRI data.

38. The method of claim 35, wherein the method of economizing MRI protocol further comprises performing ensemble summation of a plurality of calibration scan image data, and wherein ensemble summation suppresses random image variation, reducing artifacts in the reconstructed scan image.

39. The method of claim 35, wherein the method of economizing MRI protocol further comprises performing ensemble summation of a plurality of calibration scan image data, and wherein ensemble summation in the scan image data includes the use of both a coil sensitivity information and an image content similarity.

40. The method of claim 35, wherein the method of economizing MRI protocol further comprises performing ensemble summation of a plurality of calibration scan image data, and wherein ensemble summation reduces incoherent information in calibration scan image data.

41. The method of claim 35, wherein the method of economizing MRI protocol further comprises performing ensemble summation of a plurality of calibration scan image data, and wherein ensemble summation provides the coil sensitivity and anatomical structure information shared by multi-scan and multi-channel calibration scan image data for reconstruction.

42. The method of claim 35, wherein the reconstructed current MRI image is a higher-quality image reconstructed from the data acquired by undersampled calibration scans.

43. The method of claim 35, wherein the method of economizing MRI protocol further comprises performing ensemble summation of a plurality of calibration scan image data, and wherein the step of ensemble summation is accomplished by using the plurality calibration scans in the following formula:

$$c_{d_i d_j}(k) = \sum_{l \in \text{previous images}} \left\{ \frac{1}{M^l - |k|} \sum_{-M^l/2 \leq k', k'+k \leq M^l/2-1} [d_i^l(k+k')][d_j^l(k')]^{conj} \right\}.$$

44. A method of economizing a Magnetic Resonance Imaging (MRI) protocol using an MRI apparatus, the method comprising the steps of:
   collecting a plurality of prior MRI image scan data sets for a subject;
   obtaining a current MRI image scan data set for the subject; and
   reconstructing the current MRI image scan data set using an aggregate of the plurality of prior MRI image scan data sets;
   wherein the step of reconstructing the current MRI image scan data set includes the step of N-channel summation of channel-by-channel linear convolution between the current MRI image scan data set and a linear predictor; and
   wherein the step of reconstructing the current MRI image scan data set includes estimating a correlation function by ensemble summation of the plurality of prior MRI image scan data sets.

* * * * *